United States Patent
Johnson et al.

(10) Patent No.: US 11,307,019 B2
(45) Date of Patent: Apr. 19, 2022

(54) SELF-MIX MODULE UTILIZING FILTERS

(71) Applicants: Vixar, Inc., Plymouth, MN (US);
Vocalzoom Systems Ltd., Yokne'am Illit (IL)

(72) Inventors: Klein Johnson, Orono, MN (US); Tal Fishman, Haifa (IL); Tal Bakish, Modi'in (IL)

(73) Assignee: Vixar, Inc., Plymouth, MN (US)

( * ) Notice: Subject to any disclaimer, the term of this patent is extended or adjusted under 35 U.S.C. 154(b) by 0 days.

(21) Appl. No.: 17/160,093

(22) Filed: Jan. 27, 2021

(65) Prior Publication Data

US 2021/0223027 A1   Jul. 22, 2021

Related U.S. Application Data

(63) Continuation of application No. 16/309,507, filed as application No. PCT/US2017/037148 on Jun. 13, 2017, now abandoned.
(Continued)

(51) Int. Cl.
*G01B 9/02* (2006.01)
*G01B 9/02015* (2022.01)
(Continued)

(52) U.S. Cl.
CPC ..... *G01B 9/02092* (2013.01); *G01B 9/02015* (2013.01); *G02B 27/30* (2013.01);
(Continued)

(58) Field of Classification Search
CPC ............ G01B 9/02092; G01B 9/02015; G01B 2290/25; G01S 5/183
See application file for complete search history.

(56) References Cited

U.S. PATENT DOCUMENTS

| 5,020,901 A | 6/1991 | De Groot |
| 5,808,743 A | 9/1998 | Stephens et al. |

(Continued)

FOREIGN PATENT DOCUMENTS

| JP | 10-115681 A | 5/1998 |
| JP | 2000-12957 A | 1/2000 |

(Continued)

OTHER PUBLICATIONS

International Preliminary Report on Patentability for corresponding International Application No. PCT/US2017/037148 dated Dec. 18, 2018; 7 pages.

(Continued)

*Primary Examiner* — Jonathan M Hansen
(74) *Attorney, Agent, or Firm* — Winthrop & Weinstine, P.A.; Alicia Griffin Mills; Nadeem W. Schwen

(57) ABSTRACT

A system and method for generating, enhancing, and detecting the amplitude and phase modulation of a laser under a condition of self-mixing is provided. The system may comprise a laser and a detector to extract the characteristic self-mix signal, which is then interpreted using algorithms implemented in hardware or software. In the case of the laser being a Vertical Cavity Surface Emitting laser (VCSEL), the output signal can be detected by monitoring the surface light emission by means of a beam splitter, or in some embodiments as emission from the bottom surface of the laser. In some embodiments, the system may further comprise a wavelength filter such as an etalon in the signal path.

20 Claims, 17 Drawing Sheets

Related U.S. Application Data

(60) Provisional application No. 62/349,123, filed on Jun. 13, 2016.

(51) Int. Cl.
| | |
|---|---|
| *G02B 27/30* | (2006.01) |
| *H01S 5/026* | (2006.01) |
| *H01S 5/183* | (2006.01) |
| *H01S 5/02326* | (2021.01) |

(52) U.S. Cl.
CPC ........ *H01S 5/0262* (2013.01); *H01S 5/02326* (2021.01); *H01S 5/18305* (2013.01); *G01B 2290/25* (2013.01); *H01S 2301/02* (2013.01)

(56) References Cited

U.S. PATENT DOCUMENTS

| | | | |
|---|---|---|---|
| 5,825,465 A | 10/1998 | Nerin et al. | |
| 6,233,045 B1 | 5/2001 | Suni et al. | |
| 6,594,290 B2 | 7/2003 | Toida | |
| 7,126,586 B2 | 10/2006 | Jianping et al. | |
| RE41,738 E | 9/2010 | Brenner et al. | |
| 8,199,786 B2 | 6/2012 | Gaillard et al. | |
| 8,249,121 B2 | 8/2012 | Brenner et al. | |
| 8,378,287 B2 | 2/2013 | Schemmann | |
| 8,416,424 B2 | 4/2013 | Heinks et al. | |
| 8,494,018 B2 | 7/2013 | Brenner et al. | |
| 8,660,161 B2 | 2/2014 | Brenner et al. | |
| 8,692,979 B2 | 4/2014 | Moench et al. | |
| 8,989,230 B2 | 3/2015 | Dummer et al. | |
| 9,088,134 B2 | 7/2015 | Dummer et al. | |
| 9,091,747 B2 | 7/2015 | Pruijmboom | |
| 9,397,476 B2 | 7/2016 | Baier et al. | |
| 2007/0091295 A1* | 4/2007 | Xu | G01C 3/08 356/5.15 |
| 2009/0196631 A1 | 8/2009 | Daghighian et al. | |
| 2010/0328680 A1* | 12/2010 | Moench | G01S 7/4916 356/615 |
| 2012/0200858 A1 | 8/2012 | Pruijmboom | |
| 2016/0352074 A1 | 12/2016 | Brenner et al. | |
| 2019/0346360 A1* | 11/2019 | Jutte | G01N 15/06 |
| 2021/0003385 A1* | 1/2021 | Tan | G01B 9/02097 |
| 2021/0223027 A1* | 7/2021 | Johnson | G01B 9/0205 |

FOREIGN PATENT DOCUMENTS

| | | |
|---|---|---|
| JP | 2001-330509 A | 11/2001 |
| JP | 2010/526315 A | 7/2010 |
| JP | 2013-508717 A | 3/2013 |
| WO | 2014/167175 A1 | 10/2014 |
| WO | WO 2014/167175 A1 | 10/2014 |

OTHER PUBLICATIONS

International Search Report for corresponding International Application No. PCT/US2017/037148 dated Aug. 14, 2017; 3 pages.

Written Opinion for corresponding International Application No. PCT/US2017/037148 dated Aug. 14, 2017; 6 pages.

Extended European Search report for corresponding EP application No. 17813900.2 dated Apr. 29, 2020; 9 pages.

Notifications of Deficiencies for corresponding Israeli Patent Application 263638, dated Aug. 10, 2021, 11 pages.

Notice of Preliminary Rejection and English translation thereof for corresponding Korean Patent Application 10-2019-7001049, dated May 4, 2021, 12 pages.

Reasons for Rejection and English translation thereof for corresponding Japanese Patent Application No. 2018-566426, dated Mar. 2, 2021, 10 pages.

* cited by examiner

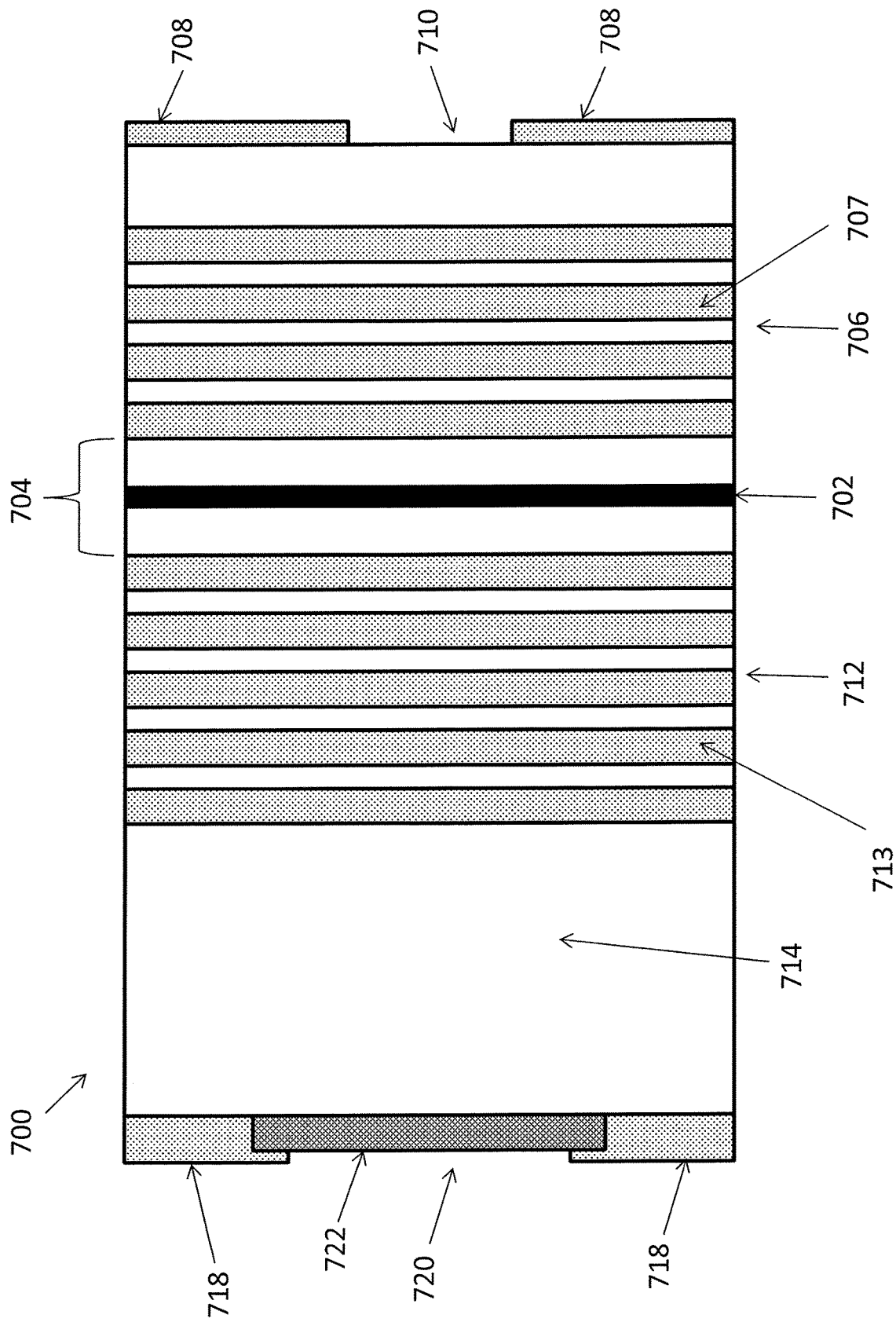

SELF-MIX MODULE UTILIZING FILTERS

CROSS-REFERENCE TO RELATED APPLICATIONS

This application is a Continuation application of U.S. application Ser. No. 16/309,507, having a local filing date of Dec. 13, 2018 and an effective filing date of Jun. 13, 2017, which is a National Phase Application of International Application No. PCT/US2017/037148, filed on Jun. 13, 2017, which claims the benefit of and priority from U.S. Provisional Patent Application No. 62/349,123, titled "Improved Self-Mix Module Utilizing Filters," filed Jun. 13, 2016, the contents of which are hereby incorporated by reference herein in their entirety.

FIELD OF THE INVENTION

The present invention disclosure is related to processing of signals and to sensors based on the mechanism of laser self-mixing. Also disclosed are means for improved packaging for the sensors.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Self-mixing, or optical feedback interferometry as it is also known, in lasers and laser diodes is a sensitive mechanism for sensing physical phenomena related to motion. This sensitivity results from the extreme sensitivity of lasers to even small levels of optical feedback, the relative phase changes in this feedback, and the fact that these phase changes occur over distance scales on the order of the optical wavelength of the light itself. Additionally, the temporal response of lasers to these changes is, in the limit, restricted only by the lifetime of the a photon within the laser cavity, itself on the order of tens of picoseconds, so the response can be very fast. Thus, the potential for high speed, sensitivity, and spatial resolution make self-mixing a very attractive sensor technology.

Self-mixing is also an attractive technology because its implementation requires a minimum of external components, and the complexity of the hardware can be relatively low. A further advantage is that the technology is inherently self-aligned. These sensors may also incorporate various levels of signal processing such as noise reduction and information extraction algorithms, which are usually highly customized the particular application and measurand of interest. The availability of high-speed application specific circuits (ASICS) allows for compact and high performance self-mix sensors.

Laser sensors based on self-mixing have been around for a long time, principally used in vibrometry, displacement, profilometry, and velocimetry. Conventional devices, such as the device described in U.S. Pat. No. 8,416,424 B2, titled "Laser Self-Mixing Measuring Device," which is incorporated by reference herein in its entirety, appears to disclose one such self-mixing measuring device with a moving diffraction grating in the optical path between the laser and the detector. Most are used in relatively short range industrial applications where the achievable signal levels are adequate for reliable detection and sensor sensitivity. Thus, increasing the achievable signal levels would lead to a broad extension of the application space addressable by this technology.

A Vertical Cavity Surface Emitting laser (VCSEL) can be a particularly suitable form of semiconductor laser for self-mixing. Self-mixing in VCSELs is known. However, VCSELs suffer from many of the same limitations as traditional lasers, namely the low achievable signal levels. Work has been done to optimize VCSELs for improving VCSEL self-mixing performance, but the degree of improvement is still not adequate for a number of interesting consumer applications envisioned here. Probably the most successful application, and a relatively recent development, is the use of VCSELs in self-mixing based sensors for optical mice, where the target distance is on the order of centimeters. Furthermore, a compact low-cost packaging approach based on VCSELs would enable increased penetration of self-mixing sensors into consumer applications and markets that would benefit significantly from their utility.

BRIEF SUMMARY OF THE INVENTION

The following presents a simplified summary of one or more embodiments of the present disclosure in order to provide a basic understanding of such embodiments. This summary is not an extensive overview of all contemplated embodiments, and is intended to neither identify key or critical elements of all embodiments, nor delineate the scope of any or all embodiments.

The systems and methods of the present disclosure may include, for example, systems, devices, and methods for improved self-mixing by utilizing a filter, particularly a Fabry-Perot filter. The systems and methods of the present disclosure may also include, for example, systems, devices, and methods for improved self-mix sensors utilizing VCSELs, particularly VCSELs designed for increased levels of bottom emission or integrated with etalons. The systems and methods of the present disclosure may provide other and/or additional benefits or advantages.

In light of the outlined limitations in scalability and sensitivity of self-mixing sensors, it is an objective of one or more embodiments of this disclosure to provide a means with which to effectively amplify the output signal from a self-mixing device. At least one embodiment of the present disclosure is based on the use of a wavelength filter, preferably a Fabry-Perot etalon, to enhance the signal amplitude by operating at a wavelength on the edge of one of the filter passbands. The wavelength filter is therefore placed in the optical path of the monitoring signal, prior to the detector. It is a further objective of one or more embodiments of this disclosure to enable smaller, more cost-effective self-mixing sensors through the use of vertical-cavity lasers. Specifically, by utilizing the substrate-side (back) emission from a VCSEL, there is no need for a separate beam-splitter component, and an efficient vertically-stacked packaging configuration may be enabled. Still another objective of at least one embodiment of the disclosure is to leverage the unique structure of the VCSEL in order to directly integrate the filter into the VCSEL structure itself.

In one or more embodiments of the disclosure, a laser self-mixing device is provided, comprising a laser for generating a laser beam, a detector for monitoring the intensity of a portion of this beam, a means with which to couple said portion of the laser light into the detector, and an optical filter in the optical path between the laser and the detector. The laser beam may be focused by means of an external lens onto a partially reflecting target, and this lens also serves to couple some of the reflected light back into the laser cavity. The optical filter may have at least one passband of narrow extent and of a wavelength such that the laser can be tuned using current or temperature or other means so as to operate on a steep region of a passband. There may be an aperture, hole, slit, or other opening located in the optical path between the filter and the detector. The coupling of some of the reflected light back into the laser cavity generates a self-mix signal with temporal, frequency, and wavelength information that relates to the relative motion of the target reflecting surface.

In one or more embodiments of the disclosure, the operation of the laser self-mixing device involves generating laser light within the laser and directing a portion of that light onto a partially reflecting target. Some of the reflected light is then coupled back into the laser cavity. Another portion of the laser light does not proceed to the target, but instead is directed towards the detector. A sample of this laser light or portion thereof is directed at the detector after passing through or reflecting off of the filter. The detector produces an output signal proportional to the amount of light incident upon its surface. This output signal is varying in time due to self-mixing effects within the laser caused by the coupling of the reflected light. The output signal is measured and processed in order to extract displacement or motion related information related to the target.

The purpose of the filter is to provide a signal to the detector that is very sensitive to the wavelength of the sampled laser beam such that very small changes in wavelength cause large changes in transmission or reflection characteristics of the filter. In other words, the probability of a photon in the sampled self-mix modulated light reaching the detector after encountering the filter depends strongly on its wavelength. Since it is in the physical nature of self-mixing signals to exhibit wavelength modulation in time synchronicity with amplitude or intensity modulation, the filter can act to as to effectively amplify or suppress the signal available for detection.

The laser may be operated such that the wavelength of the emitted light corresponds to a region of relatively steep change in the filter transmission or reflection characteristics. If operating on a rising edge of the filter characteristic, where the transmission or reflection is increasing as wavelength is increasing, and the increase in the intensity of the sampled light signal is accompanied by a shift to longer wavelength, the effect is additive (in phase) and the apparent peak-to-peak modulation of the signal will be increased. If operating on a falling edge of the filter characteristic, where the transmission or reflection is decreasing as wavelength is increasing, and the increase in the intensity of the sampled light signal is accompanied by a shift to longer wavelength, the effect is subtractive (out of phase) and the apparent peak-to-peak modulation of the signal will be reduced. If operating on a rising edge of the filter characteristic, where the transmission or reflection is increasing as wavelength is increasing, and the increase in the intensity of the sampled light signal is accompanied by a shift to shorter wavelength, the effect is subtractive (out of phase) and the apparent peak-to-peak modulation of the signal will be reduced. If operating on a falling edge of the filter characteristic, where the transmission or reflection is decreasing as wavelength is increasing, and the increase in the intensity of the sampled light signal is accompanied by a shift to shorter wavelength, the effect is additive (in phase) and the apparent peak-to-peak modulation of the signal will be increased.

In principle, this aspect of various embodiments disclosed herein will work with all kinds of lasers where the self-mixing effect can occur. Various embodiments disclosed herein can be employed in a system using a beam splitter to sample the laser light that is not directed towards the target. Embodiments disclosed herein can likewise be used in a system where the sampled portion of the laser light is derived from emission from the back facet in the case of an edge-emitting laser or the substrate surface in the case of a VCSEL. It is also possible that the filter element can serve a dual function as both the filter and the beam sampling component, i.e. the beam-splitter.

A further aspect of various embodiments disclosed herein is the reduction of packaging size and complexity by using a substrate-emitting VCSEL laser. Typical VCSELs are designed with a very high reflectivity bottom mirror (>99.9%), and as such almost all of the optical power is emitted through the top surface mirror with a lower reflectivity, typically <99.6%. By reducing the reflectivity of the bottom mirror, the amount of laser light emitted through the substrate can increase. If the VCSEL is then mounted in a position above the detector, this bottom-emitted light is available for monitoring the self-mix signal. Thus, the need for a beam splitter is removed. The VCSEL can be stacked directly on the detector or set at a distance with an intermediate air gap. The partially bottom emitting VCSEL is advantageous for packaging with an etalon. Preferably, the VCSEL has patterned metal on the substrate side with holes or apertures which serve to let the laser light pass while suppressing unwanted spontaneous emission light. The presence of spontaneous emission at the detector can cause an unwanted detector signal that degrades the signal-to-noise ratio. The substrate emitting surface may also be coated with a low-reflectivity coating to reduce signal loss, improve linearity of the laser power emission as a function of injected current, and reduce or minimize perturbations to the laser cavity light itself.

To further reduce sensor size, cost, and packaging complexity while improving performance, embodiments disclosed herein may utilize a VCSEL laser directly integrated with an etalon. The VCSEL, being in part comprised of a highly reflective mirror adjacent to an optically transparent substrate, can incorporate the etalon filtering functionality by coating the substrate final surface with a highly-reflective (HR) mirror coating. In such case the substrate is itself the cavity spacer region of the etalon, bounded on one side by the VCSELs bottom DBR and by the HR coating on the other. Due to the divergence of the beam and the small beam diameter of the laser illumination within the etalon cavity, the expected performance may not be ideal, but may prove adequate to yield significant signal enhancement.

In one embodiment of the present disclosure, the self-mixing sensor device comprises an injection molded plastic housing onto which is affixed a partially bottom-emitting VCSEL with a top-to-bottom emission ratio of 2:1. The VCSEL emits light at a wavelength of, for example, 940 nm. The substrate surface of the VCSEL is metallized with a patterned metal film, the pattern being, for example, a series of 20 μm diameter apertures aligned on the centers of the VCSEL emitting regions. The interior of the apertures may be coated with an anti-reflective coating, such as but not limited to, ¼ optical wave of silicon nitride. The VCSEL has anode and cathode electrical contacts on the top surface of the VCSEL chip. Placed beneath the VCSEL is a lens that is formed as part of the injection molded housing. The purpose of the lens is to collimate the laser emission and expand the beam size. On the opposite side of the lens from the VCSEL is an etalon to serve as the wavelength filter, also affixed to the plastic package. In one embodiment, the etalon comprises a layer of fused silica coated on at least one side with at least partially reflective mirrors or a partially reflective coating. The embodiment further comprises a sub-mount to which a silicon detector and the plastic housing are attached. When assembled, the detector is facing the final surface of the etalon with an intervening air gap. The sub-mount further provides the electrical interface to the device, namely the laser anode and cathode, and the detector anode and cathode. External to the housing is a lens for focusing the laser beam at the target and collecting the reflected return light. The lens also serves to couple a portion of the return light into the VCSEL cavity.

Various embodiments disclosed herein can be used in sensors for measuring target motion, displacement, vibration, and related motion artifacts. In some embodiments, it may be suitable for applications requiring sensing at distances on the order of 1 meter or more. In some embodiments, it may be suitable for applications requiring sensing at distances of less than 1 meter. These can be any type of industrial or consumer application requiring sensing of for example, target motion, displacement, vibration, and related motion artifacts.

In an example of a self-mix sensor described in this application, a single-mode laser source emits a light beam which is focused or directed by a lens to a target, which may be an object, a figure, or a surface. The laser signal is scattered from the target and a portion returns to the laser, and re-enters the laser through a facet of the laser. This return signal mixes with the outgoing signal. When the roundtrip distance from the VCSEL to target and back results in the outgoing and incoming signals being in phase, they interfere constructively, resulting in increased optical output from the laser. When the roundtrip distance from the VCSEL to the target and back results in the outgoing and incoming beams being out of phase they interfere destructively, resulting in a decreased optical output from the laser. As the target moves, the return beam moves in and out of phase with the transmitted beam, producing a self-mix signal characterized by temporal fluctuations or oscillations. Each oscillation corresponds to a movement equivalent to one wavelength.

In one or more embodiments, a sensor device for laser light emission may comprise at least one laser emitting a light from at least one aperture, the laser comprising a cavity and at least one mirror; a detector; a filter in a fixed position relative to the cavity; and at least one optical lens that approximately focuses a portion of the laser emission onto a target surface and couples a portion of any light reflected from the target surface back into the laser cavity, wherein a first optical path carries a first portion of the light emitted from the laser between the laser and the target surface and a second optical path carries a second portion of the light emitted from the laser between the laser and the detector, wherein the target surface is disposed only within the first optical path; and wherein the filter is disposed within at least the second optical path. The filter may be disposed within the first optical path and the second optical path. The laser may be a VCSEL. The detector may be grown on the same substrate as the laser. The filter may be one of a grating or an etalon. The laser may have multiple apertures for emitting light. The sensor device may further comprise a means of sampling a portion of the laser light emission and presenting it to the detector. The means of sampling may be a beam splitter. The beam splitter may be positioned at an angle relative to an optical axis of the laser. The filter may be in the optical path of the sampled portion of the laser light emission. In some embodiments, the sampled portion is not greater than 50% of the laser light emission. In some embodiments, the sampled portion is not less than 10% of the laser light emission. The laser may be a VCSEL and the light may be emitted through a bottom surface of the VCSEL. The laser may comprise a bottom emitting surface with a coating. The coating may be antireflective or reflective at the wavelength of the laser light emission. The detector may be selected from the group consisting of: a photodetector, PIN photodetector, a resonant cavity photodetector, or an avalanche photodiode. The laser may be an edge-emitting laser, a VCSEL, a solid-state laser, a gas laser, or any other suitable laser. The light, in some embodiments, may have a wavelength between about 800 nm and 1000 nm. The filter may be comprised of a grating and a spatial filter or slit. The filter may be an etalon with a Free Spectral Range of less than about 5 nm. The filter may be an etalon with a Free Spectral Range of less than about 1 nm. The filter may be an etalon with a finesse greater than about 5. The filter may be an etalon with a finesse greater than about 10. The filter may have a transmission peak and a full width at half max transmission bandwidth of the transmission peak nearest a wavelength of the light is less than or equal to 1 nm. The laser may have multiple emitting apertures. In some embodiments, the laser may be a VCSEL having at least one mirror and a substrate, and the filter is an etalon comprising at least one mirror of the VCSEL and the substrate. The laser may further comprise a reflective coating on the substrate. In some embodiments, the filter is mounted to the detector. In some embodiments, the laser is a VCSEL and the laser is mounted to the filter. In some embodiments, the laser is a VCSEL having a top surface and a bottom surface, and a ratio of a peak optical power emitted from the top surface to the peak optical power emitted from the bottom surface is between 1:1 and 10:1. In some embodiments, the sensor device further comprises a housing.

In one or more embodiments, a packaged sensor device comprises a housing; a laser emitting a light from an aperture, the light having a wavelength; a detector mounted to a substrate at a first end of the housing; a filter disposed between the laser and the detector; and at least one optical lens at a second end of the housing. In at least one embodiment, the least one optical lens is disposed between a bottom emitting surface of the laser and the filter to collimate the light. In some embodiments, the wavelength may be between about 800 nm and 1000 nm. In at least one embodiment, the laser is a VCSEL. In some embodiments, the housing is comprised of molded plastic. At least in embodiments where the housing is comprised of molded plastic, the at least one optical lens may be integrally formed with in the housing. In other embodiments, the housing may comprise metal and the lens may be a plastic insert affixed to the housing. In some embodiments, at least the detector and the filter are disposed within a cavity the housing. In some embodiments, the laser is mounted within a recess on an exterior surface of the housing. In some embodiments, the substrate is mounted to the housing. The housing may have at least one feature that allows sufficient clearance for wirebond interconnects to the laser and the detector. The housing may have at least one feature for passive alignment and assembly of the laser and the filter. In some embodiments, the detector may be selected from the group consisting of: a photodetector, PIN photodetector, a resonant cavity photodetector, or an avalanche photodiode. In some embodiments, the filter may be an etalon. In some embodiments, the filter may be mounted to the detector. The filter may, in some embodiments, be separate from the laser. The filter and the laser may form a monolithic structure. In some embodiments, the filter may comprise a material that exhibits low optical loss at the wavelength. In at least one embodiment, the filter has two faces in parallel, wherein each face has a mirror that is highly reflective at the wavelength. In some embodiments, the filter may have a Free Spectral Range less than about 5 nm. In some embodiments, the filter may have a Free Spectral Range less than about 2 nm. The filter may have a finesse greater than 5. In some embodiments, the filter may have a finesse greater than 10. The filter may, in some embodiments, have a transmission peak and a full width at half max transmission bandwidth of the transmission peak nearest a wavelength of the light is less than or equal to 1 nm. The laser may have multiple emitting apertures. In some embodiments, the laser may be a VCSEL having at least one mirror and a substrate, and the filter may be an etalon comprising at least one mirror of the VCSEL and the substrate. In some embodiments there may be a reflective coating on the substrate. In some embodiments, the laser may be a VCSEL and the laser may be mounted to the filter. In at least another embodiment, the laser is a VCSEL having a top surface and a bottom surface, and a ratio of a peak optical power emitted from the top surface to the peak optical power emitted from the bottom surface is between 1:1 and 10:1. In some embodiments, the laser may be a VCSEL having a substrate, and the substrate has a pattern of apertures on at least one side for the suppression of spontaneous emission of light.

In one or more embodiments, a sensor device for laser light emission may comprise at least one laser emitting a light from at least one aperture, the laser comprising a cavity and at least one mirror; a detector; a filter in a fixed position relative to the cavity; at least one optical lens that approximately focuses a portion of the laser emission onto a target surface and couples a portion of any light reflected from the target surface back into the laser cavity; and a beam splitter between the optical lens and the laser. The sensor device may further comprise a means of sampling a portion of the laser light emission and presenting it to the detector. The means of sampling may be a beam splitter. The beam splitter may be positioned at an angle relative to an optical axis of the laser. The filter may be in the optical path of the sampled portion of the laser light emission. In some embodiments, the sampled portion is not greater than 50% of the laser light emission. In some embodiments, the sampled portion is not less 10% of the laser light emission. The laser may be a VCSEL and the light may be emitted through a bottom surface of the VCSEL. The laser may comprise a bottom emitting surface with a coating. The coating may be anti-reflective or reflective at the wavelength of the laser light emission. The detector may be selected from the group consisting of: a photodetector, PIN photodetector, a resonant cavity photodetector, or an avalanche photodiode. The laser may be an edge-emitting laser, a VCSEL, a solid-state laser, a gas laser, or any other suitable laser. The light, in some embodiments, may have a wavelength between about 800 nm and 1000 nm. The filter may be comprised of a grating and a spatial filter or slit. The filter may be an etalon with a Free Spectral Range of less than about 5 nm. The filter may be an etalon with a Free Spectral Range of less than about 1 nm. The filter may be an etalon with a finesse greater than about 5. The filter may be an etalon with a finesse greater than about 10. The filter may have a transmission peak and a full width at half max transmission bandwidth of the transmission peak nearest a wavelength of the light is less than or equal to 1 nm. The laser may have multiple emitting apertures. In some embodiments, the laser may be a VCSEL having at least one mirror and a substrate, and the filter is an etalon comprising at least one mirror of the VCSEL and the substrate. The laser may further comprise a reflective coating on the substrate. In some embodiments, the filter is mounted to the detector. In some embodiments, the laser is a VCSEL and the laser is mounted to the filter. In some embodiments, the laser is a VCSEL having a top surface and a bottom surface, and a ratio of a peak optical power emitted from the top surface to the peak optical power emitted from the bottom surface is between 1:1 and 10:1. In some embodiments, the sensor device further comprises a housing.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the invention will be better understood from the following description taken in conjunction with the accompanying Figures, in which:

FIG. 7 is a schematic view of a VCSEL structure for bottom emission.

DETAILED DESCRIPTION

Figure 1:
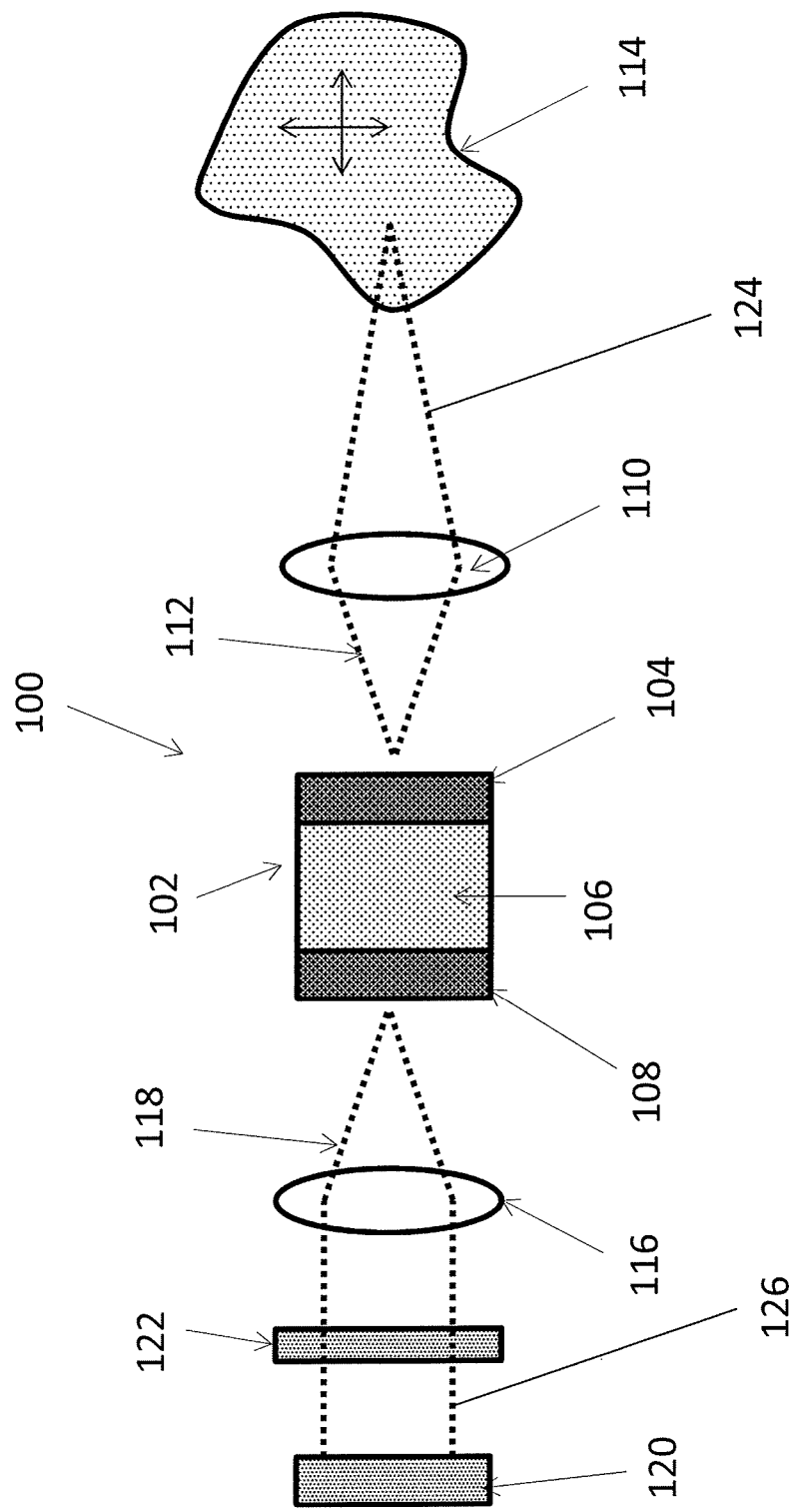
FIG. 1 is a schematic view of a self-mixing optical system, in accordance with one embodiment of the present disclosure.

The present disclosure relates to processing of signals and to sensors based on the mechanism of laser self-mixing, as well as packaging for the sensor.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Functions, operations, components and/or features described herein with reference to one or more embodiments of the present disclosure, may be combined with, or may be utilized in combination with, one or more other functions, operations, components and/or features described herein with reference to one or more other embodiments of the present disclosure. The present disclosure may thus comprise any possible or suitable combinations, re-arrangements, assembly, re-assembly, or other utilization of some or all of the modules or functions or components that are described herein, even if they are discussed in different locations or different chapters of the discussion, or even if they are shown across different drawings or multiple drawings.

While certain features of the present disclosure have been illustrated and described herein, many modifications, substitutions, changes, and equivalents may occur to those skilled in the art. Accordingly, the claims are intended to cover all such modifications, substitutions, changes, and equivalents.

When a laser beam is back-scattered from an external target, the laser beam may, in some circumstances, have a portion of its reflected power coupled back into the laser cavity. This back-coupled light will naturally interfere with the standing wave within the cavity, and introduce instabilities or variations in the optical power and frequency (wavelength) of the emitted light. This variation in optical power can be monitored at any point in the optical path by means of a photodetector. Forward propagating light may be split off or sampled from the primary laser beam and directed onto a detector. Alternatively, backward-propagating light in the form of a secondary beam emitted from the laser may be directly incident on the detector.

There is a time delay and a phase associated with the reflected light upon coupling back into the laser cavity. The interaction with the standing wave is therefore quite complex, and generally leads to a modification of the threshold condition of the laser. If the electrical bias or pumping power is held constant, this change in the threshold condition manifests as a change in emitted optical power. Algorithms may be applied to derive the specifics of target motion and distance by interpreting these power fluctuations. Since the change in threshold condition also implies a change in steady-state carrier density, the wavelength of the emitted light is also affected with the same temporal dependence.

While a laser is very sensitive to optical feedback, the absolute magnitude of the changes in the output of a laser under feedback can be small and noisy. Therefore, since the strength of the self-mix signal is by nature very low even under ideal conditions, it is desirable to improve signal to noise ratio.

The self-mixing signal appears as periodic amplitude fringes, each of these fringes corresponding to a total phase shift in the reflected light equal to one-half optical wavelength, or ½ wave. The magnitude of the fringes is dependent upon the specifics of the laser design and the strength of the feedback (i.e., the amount of light coupled back into the cavity). More coupling generally gives a stronger signal. Methods to increase the amount of feedback coupling include using large aperture or high numerical-aperture optics, changing the target composition or reflectivity, or reducing the distance to the target. In some cases, the target composition is fixed or otherwise not under user control, and the reduction of sensor size is important. In such a case, the primary means of signal enhancement is to optimize the laser design for high sensitivity to self-mixing. There is a limit to how much improvement can be attained because, at some level of feedback, the laser will become unstable and self-mixing will become erratic.

A self-mix signal generally consists of the aforementioned fringes, or modulated component (signal), superimposed upon a constant background signal level, or bias. The ratio of the modulated component (signal) to the bias component may be referred to as the modulation depth m. In a stable operating regime, a typical laser may exhibit modulation depths m on the order of <0.5% under high levels of coupled optical feedback. There is frequently a desire to minimize optical power from the laser. If a laser is emitting 1 mW of optical power, the approximate signal is therefore approximately 5 peak-to-peak. Using a typical silicon photodetector with a responsivity of 0.5 A/W, this means that the electrically converted signal value is 2.5 µA peak-to-peak. This is a small value that can be overwhelmed by background noise in the detection circuitry. Reductions in the level of feedback due to smaller optics, reduced target reflectivity, and/or increased target distance may lead to a commensurate reduction in signal level and may exacerbate the problem. Therefore, increasing this signal level is of significant importance.

Instead of detecting the change in the optical power of the laser under self-mixing modulation, the internal junction voltage can be monitored. This has the advantage of eliminating the photodetector, but due to the very low signals attainable, this approach has inherently limited utility.

This is the common FP, or Fabry-Perot laser formed by cleaving the end facets of the active crystal to form the required cavity and mirrors. FP lasers are convenient for this application because they are typically packaged with so-called back-facet monitor photodiodes in the same package. Thus, in the case where an edge-emitting laser is used, the self-mixing detector can be the back-facet monitor photodiode co-packaged with the laser diode itself.

The lasers used in self-mixing sensors may be gas lasers, solid-state lasers, or semiconductor lasers. Many self-mixing based sensors utilize edge-emitting laser diodes. A Vertical Cavity Surface Emitting laser (VCSEL) can be a particularly suitable form of semiconductor laser for self-mixing. A VCSEL is a semiconductor laser comprised of a substrate upon which are sequentially deposited a first bottom Distributed Bragg Reflector (DBR) mirror, an active light generating active region called the cavity, and a second top DBR mirror. Light is emitted in the normal direction to the device top surface.

The vertically emitting nature of a VCSEL gives it much more packaging flexibility than a conventional laser, and opens up the door to the use of the wide range of packages available for LEDs or semiconductor integrated circuits (ICs). VCSEL arrays can be packaged with photodetectors or optical elements in a vertically stacked configuration. Plastic or ceramic surface mount packaging or chip-on-board options are also available to the VCSEL.

Multiple lasers with separate emitting apertures can be fabricated on the same chip. These apertures may be connected electrically in serial, parallel, or individually addressable. In the case of an array of individually addressable apertures on the same VCSEL chip, the effect of beam-steering can be achieved by selectively illuminating one or more apertures. When used with a lens, this allows one to illuminate regions in a field of view without the need for any mechanical motion. Parallel arrays of self-mixing sensors can also be constructed from VCSELs.

The present disclosure may comprise systems, circuits, methods and devices for improving and/or increasing Self-Mix (SM) signal, by utilizing one or more filters, for example by using a Fabry-Perot filter and/or other suitable filter(s); as described herein. A system may comprise, in at least one embodiment: a laser-based transmitter; an optical sensor to capture optical feedback learned from the area-of interest; and an optical processor to process the optical feedback and generate a signal (e.g., a stream of data; a data-stream; a data corresponding or imitating or emulating an audio signal or an acoustic signal) that corresponds to an optical feedback.

The terms "bottom" and "top" in discussing the laser structure can be freely interchanged, with the term "bottom" generally used to reference the secondary mirror facing towards the optical detector. In the case of a VCSEL, this is generally to be interpreted as the substrate side of the device. In the case of an arbitrary laser cavity design such as an edge-emitting Fabry-Perot laser, solid-state laser, or gas laser, or similar, the terms "bottom" and "top" could be "left" and "right" or "primary" and "secondary" with equal validity, and these terms are only meant to distinguish the two unique reflecting surfaces which comprise the laser cavity.

The terms "filter" and "wavelength selective element" may be used interchangeably in the discussion. A filter may be an etalon or a grating, and may operate in at least one of a transmissive mode or a reflective mode.

For most commercial sensor applications, it is desirable to use optical wavelengths imperceptible to the human eye. This is in the near infrared (NIR) range of the spectrum, and the range most commonly of interest is 835 nm-980 nm. In one embodiment, 940 nm may be a preferred wavelength as it gives very low visibility and is near the highest sensitivity of low-cost silicon based photodetectors.

FIG. 1 shows, by way of example, a self-mixing sensor device 100 comprised of a laser 102 with a first mirror 104, a light-generating cavity 106, and a second mirror 108; a first optical lens 110 for focusing the light 112 emitted from the said first mirror 104 onto a target 114; a second optical lens 116 for approximately collimating the light 118 emitted from the said second mirror 108 and directing it towards a detector 120. In at least one embodiment, the target 114 may be a partially reflective target. In at least one embodiment, the target 114 may be a moving target. In one alternative embodiment, the second optical lens 116 may be optional, in which case the light 118 from the second mirror 108 is not collimated. Disposed between the detector 120 and the second mirror 108 may be an optical filter 122. In some embodiments, the filter 122 is in a fixed position relative to the laser, the detector, or both. If the second lens 116 is present, said filter 122 may be disposed between the second lens 116 and the detector 120. There are therefore two optical paths defined in the system: a first path 124 from the first mirror 104 to the target 114, and a second path 126 from the second mirror 108 to the detector 120. The filter 122 may thus be in the second path 126. In at least one embodiment, the filter is in a fixed position. In operation, for many if not all of the embodiments discussed herein, the signal present at the detector terminals is a self-mix signal, generated by intra-cavity mixing of native laser cavity light with light reflected or scattered from a static target or a moving target. The self-mixing signal may be enhanced by the wavelength filtering action of a filter, such as but not limited to, an optical filter with steeply defined passband edges. In some embodiments, the laser can emit light in a range of between about 850 nm and 940 nm. In one embodiment, the laser emits light at or near about 850 nm. In one embodiment, the laser emits light at or near about 940 nm.

Figure 2:
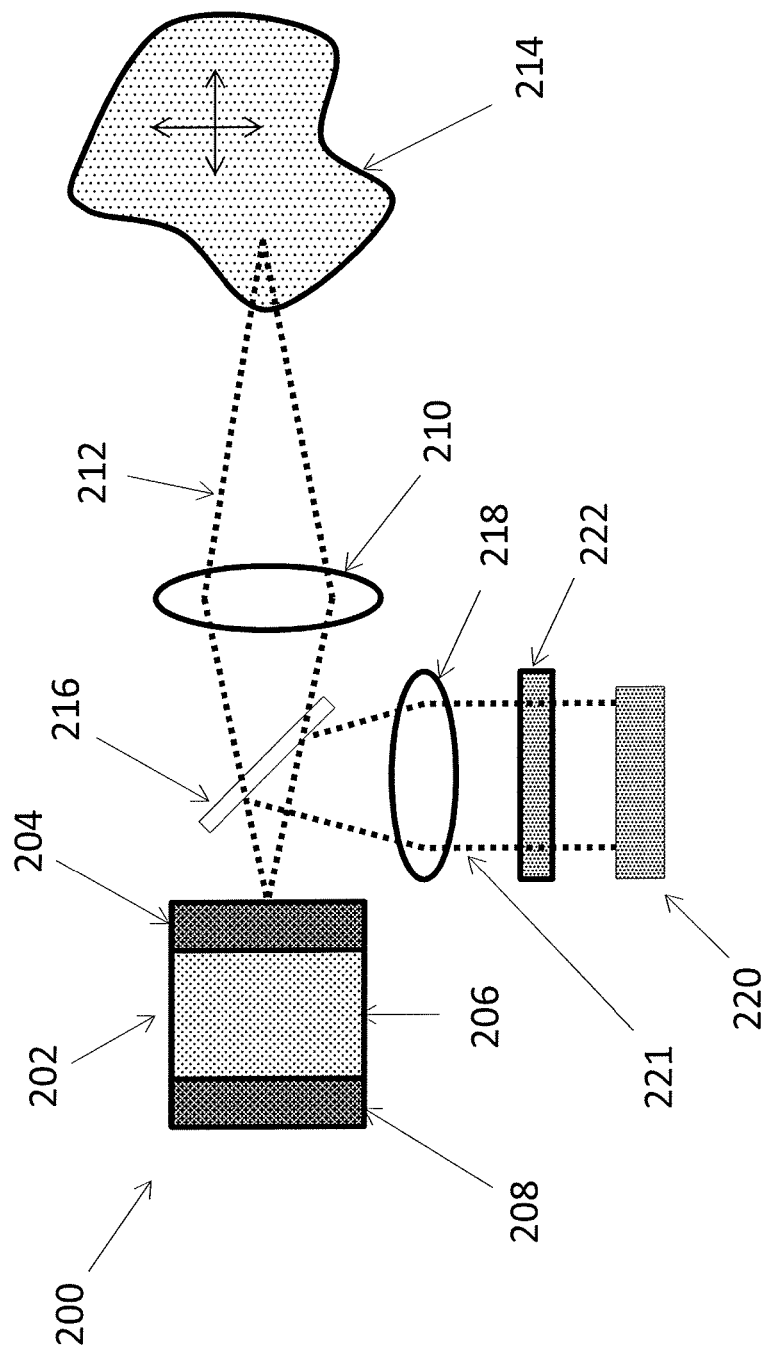
FIG. 2 is a schematic view of a self-mixing configuration with a beam-splitter for sampling laser light, in accordance with one embodiment of the present disclosure.

FIG. 2 shows an alternative self-mixing sensor device 200 configuration again comprised of a laser 202 with a first mirror 204, a light-generating cavity 206, and a second mirror 208; a first lens 210 for focusing the light 212 emitted from the first mirror 204 onto a partially reflective target 214; and a beam sampling element 216, that redirects a portion of the light 212 from the first mirror 204 onto a second lens 218 which approximately collimates the light and directs it onto a detector 220. In one embodiment, the beam sampling element 216 is a beam splitter. In at least one embodiment, the beam splitter is positioned at an angle relative to the optical axis of the laser 202. Disposed in the optical path 221 between the second lens 218 and the detector 220 may be an optical filter 222. In another embodiment, the second lens 218 is not present and the filter 222 may be disposed between the beam splitter 216 and the detector 220. In yet another embodiment, the beam sampling element 216 of FIG. 2 can be disposed between the first lens 210 and the target 214, in which case the second lens 218 may be omitted. In other embodiments, the beam sampling element and the filter can form a combined sampling component. An etalon tilted at an angle with respect to the optical axis of the incident beam would be an example of such a combined sampling component. In such embodiments, the tilted combined sampling component could be disposed between the first mirror 204 and the detector 220. In some embodiments, the detector 220 and the filter 222 can be positioned in parallel with the optical axis of the laser 202. In some embodiments, the detector 220 and the filter 222 can be positioned perpendicular to the optical axis of the laser.

In both FIG. 1 and FIG. 2, the laser 102, 202 is preferably a semiconductor laser, but may be a gas laser or a solid-state laser. In a preferred embodiment, the laser is a VC SEL.

In both FIG. 1 and FIG. 2, the detector 120, 220 may preferably be a photodiode. The detector 120, 220 may a broadband photodetector or a resonant-cavity photodiode. The detector 120, 220 converts the light energy into a signal, such as a current proportional to the light energy, intensity, or power. This current can be amplified for further signal processing.

Figure 3:
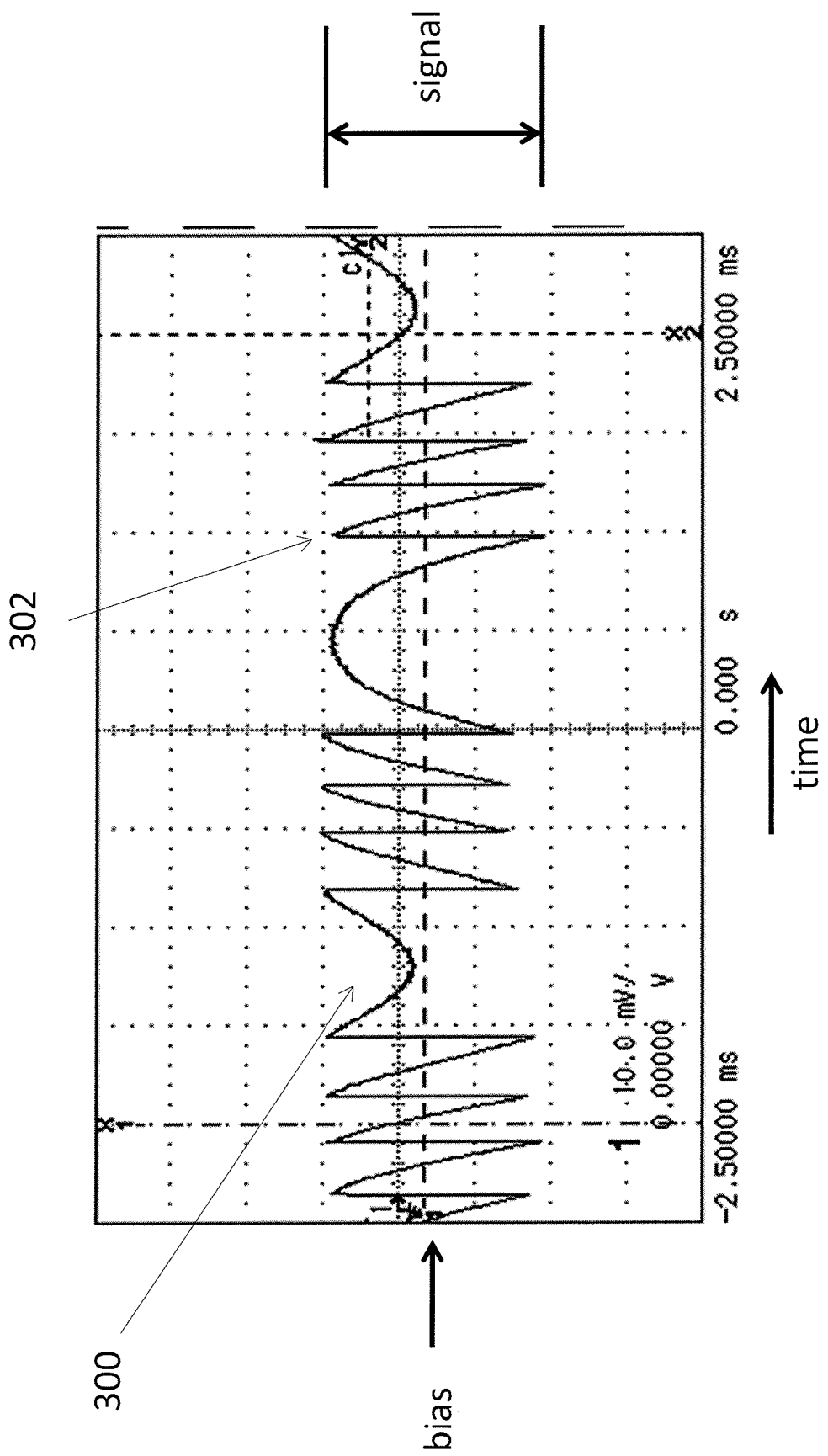
FIG. 3 is a graph illustrating a self-mix signal showing periodic saw-tooth fringes generated as a target is displaced through integral multiples of the laser free-space wavelength.

FIG. 3 shows a characteristic self-mix signal 300 present at the detector when light scattered or reflected from the target is coupled by the first lens into the laser cavity through the first mirror when the target is in motion relative to the laser cavity. The signal 300 has periodic or otherwise time-dependent "sawtooth" fringes 302 due to coherent mixing of the coupled light with the existing standing wave in the cavity. The form and time dependence of the "sawtooth" fringes 302 encode information related to the specifics of the target location and motion. The signal 300 is further characterized by its peak-to-peak amplitude and DC offset as shown in FIG. 3. The amplitude of the peak-to-peak fluctuations can be important because it impacts the reliability with which signal processing can extract motion data from the inherently noisy background caused by environmental disturbances and electronics background noise. The temporal frequency, the shape, and the slope of the fringes yields information as to the relative motion of the target with respect to the source, as well as the absolute distance to the target.

Figure 4:
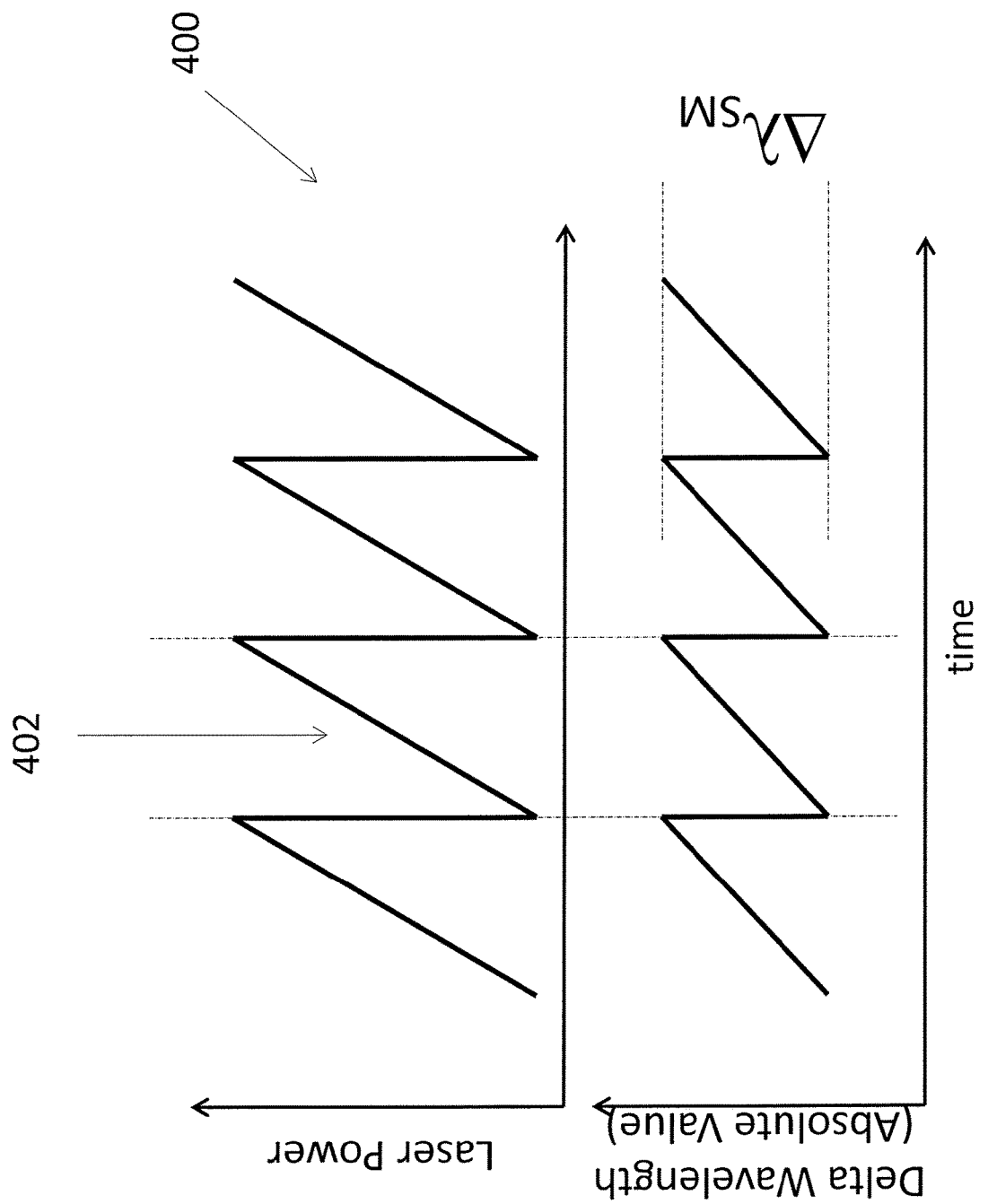
FIG. 4 is a graph illustrating the variation in time of self-mix laser intensity and wavelength signals.

FIG. 4 indicates how the time-change in the self-mix signal 400 amplitude is accompanied by a simultaneous and correlated shift in the absolute value of the laser wavelength. Over the period of one sawtooth 402, the absolute value of the laser wavelength changes by an amount $\Delta\lambda_{SM}$, where $\Delta\lambda_{SM}$ depends on the conditions of the feedback, and may be on the order of picometers or more. If the self-mix signal passes through an optical filter with a near step-like response with the center wavelength of the signal approximately centered on the mid-point of the step response, the filter transmission will convolve the spectral and amplitude components of the signal and lead to significant apparent amplification of the transmitted signal observable by the detector.

The optical filter can be implemented in multiple ways, such as by using a highly dispersive diffraction grating and a slit. In one embodiment, the filter is a Fabry-Perot etalon. An etalon is an optical element consisting of two plane-parallel mirrors separated by an optically transparent spacer cavity region. Due to constructive and destructive interference of multiple reflections within the etalon cavity, the transmission characteristics of an etalon may exhibit multiple narrow-band peaks at wavelengths where resonance occurs.

Figure 5:
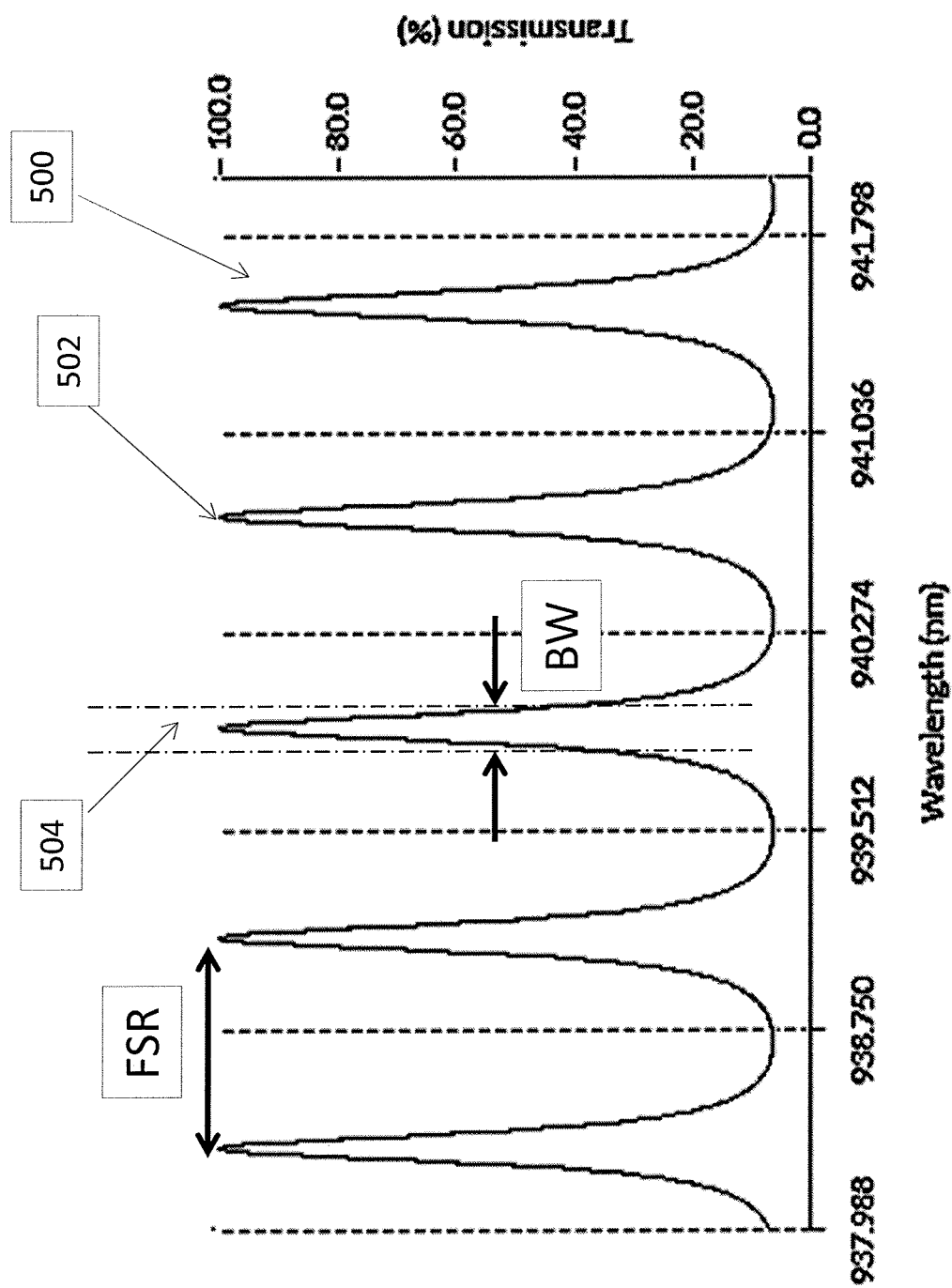
FIG. 5 is a graph illustrating a Fabry-Perot etalon transmission characteristic as a function of incident optical wavelength.

FIG. 5 shows an example of such an etalon transmission characteristic vs wavelength. The transmission 500 is characterized by its Free Spectral Range (FSR), passband bandwidth (BW), peak frequencies, and peak transmission percent. The Free Spectral Range (FSR) of an etalon is the difference in wavelength of two adjacent peaks in the etalon transmission. FSR is determined primarily by the thickness of the etalon, i.e. the distance between the surfaces of the mirrors which comprise the etalon. The thicker the cavity, the closer the resonant transmission peaks shown at 502. The bandwidth of each transmission peak is determined largely by the constituent mirror reflectivities. It is generally taken as the full width of the passband at a 50% transmission. The higher the reflectivity, the narrower the bandwidth. In principal, near infinitely narrow bandwidth can be achieved for reflectivities approaching 100%. Total percent transmission is limited by the quality of construction and the characteristics of the input beam. The finesse f is a measure of etalon performance and is equal to the ratio of the FSR to the bandwidth (i.e. f=FSR/BW). For use as described here, the etalon would desirably have multiple transmission peaks within the tunable range of the laser. This is because the laser must operate on a rising or falling edge of the passband shown at 504. The wavelength and amplitude change of the self-mix signal being in-phase (mutually increasing or mutually decreasing) or out-of-phase (changing in opposite directions) will dictate the correct operating point being a rising edge or a falling edge of the filter passband.

In a simplified assumption, for illustrative purposes, the peak passband transmission of the etalon can be assumed to be 100%, and each transmission passband can be approximated by a triangle with a base width of 2*BW. Under this assumption, the transmission then goes from approximately zero to 100% over a spectral range of wavelength shift of $\Delta\lambda$=BW. The total wavelength shift $\Delta\lambda_{SM}$ over the period of one self-mix sawtooth can further be assumed to be 20 picometers, or 0.02 nm. If, at a minimum, we desire to achieve a 50% enhancement in signal level, this implies a required bandwidth of BW=2*$\Delta\lambda_{SM}$=0.04 nm. The finesse of the required etalon is then approximately f=15, an achievable performance target for a real etalon. A further decrease in the passband bandwidth will yield a proportionately greater degree of signal enhancement. Thus, increasingly higher finesse can be desirable. With an FSR<1 nm, a minimum finesse of 5 typically provides observable enhancement, and f~10 typically provides significant enhancement.

Figure 6A:
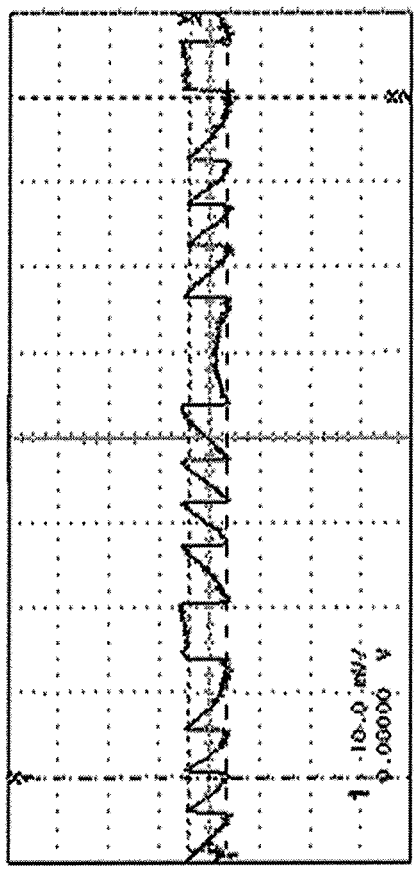
FIG. 6A-6E are graphs illustrating the enhancement of self-mix signal with an etalon in the optical path.
Figure 6C:
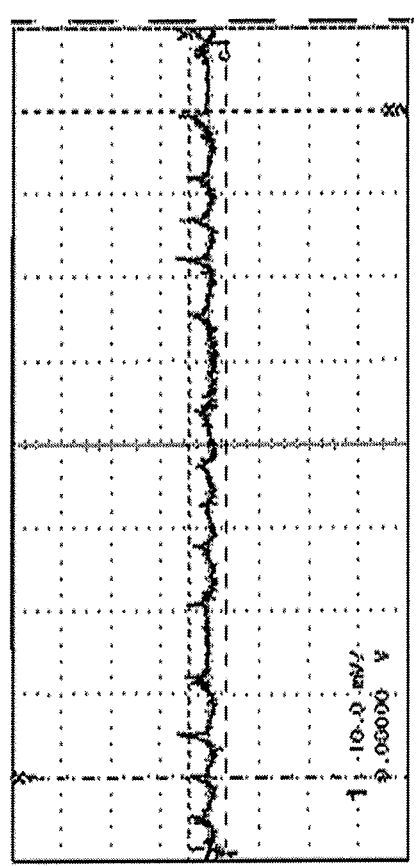
Figure 6B:
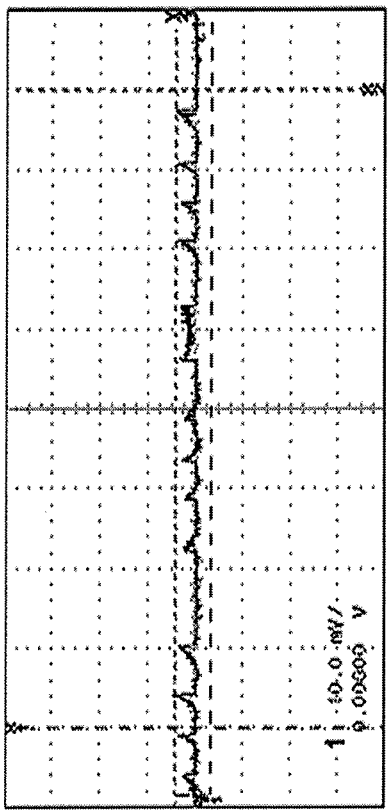
Figure 6D:
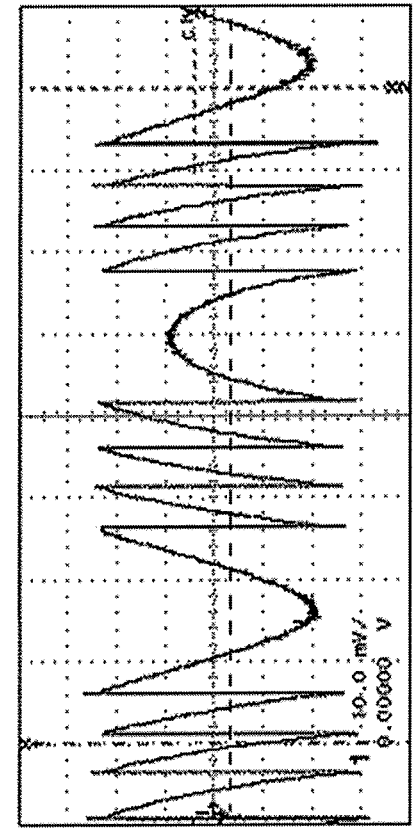
Figure 6E:
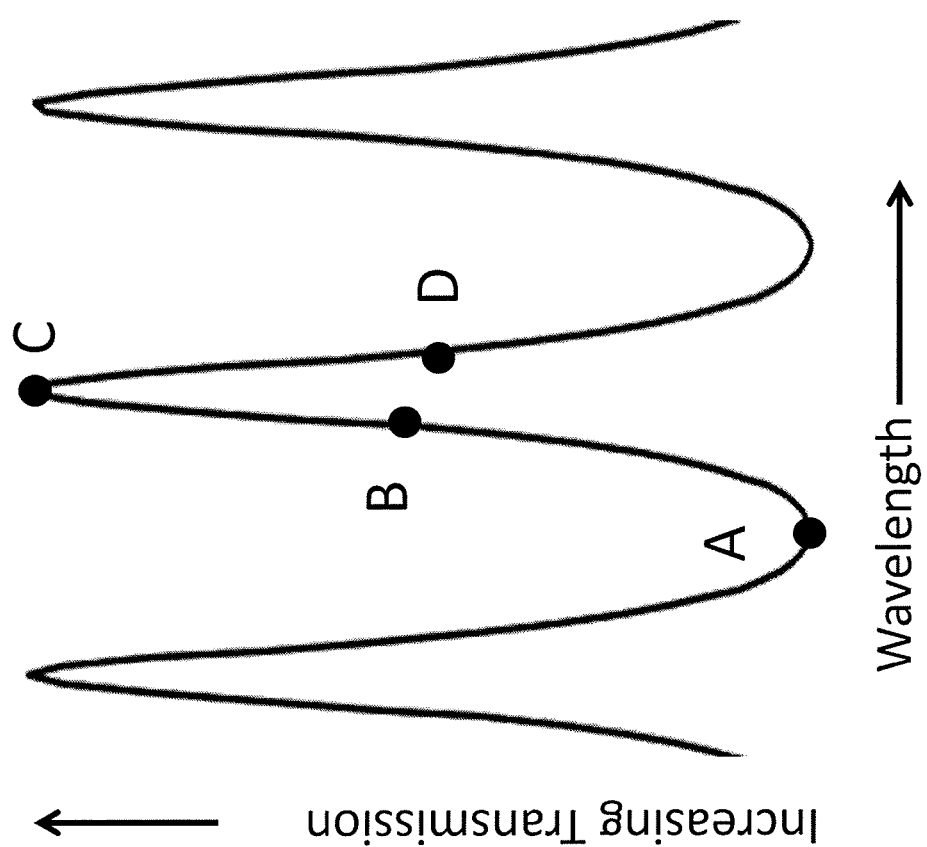

FIGS. 6A-6E show example outputs of an etalon filtered self-mix signal using an etalon with f~15. FIG. 6E shows the transmission curve scaled for clarity, and is not meant to be an exact representation of an f=15 etalon. At point "A" on FIG. 6E where the etalon transmission is at a minimum, the total signal is extinguished due to the lack of any light penetrating the etalon as shown in FIG. 6A. At point "C" on FIG. 6E, the etalon transmission is at a maximum and at an inflection point with zero slope, so the signal is relatively unchanged as shown in FIG. 6C. At point "D" on FIG. 6E, the absolute value of the transmission slope change is high but out-of-phase with the direction of amplitude change and so the signal modulation is extinguished, as shown on FIG. 6D. At point "B" on FIG. 6E, which may generally be an optimal point of operation, the amplitude and wavelength changes are in-phase resulting in a significant signal enhancement as shown on FIG. 6B.

In one embodiment, a VCSEL-based self-mixing sensor is closely integrated with an etalon in a small package using a VCSEL that emits a significant portion of its light out of the bottom surface. To illustrate the issue, FIG. 7 is a diagram of the cross-section of an example VCSEL 700, and includes general structural elements and components that may be utilized, as an example, for VCSEL and VCSEL array embodiments disclosed herein. The disclosure herein is not intended be limited to any particular VCSEL, VCSEL configuration, or VCSEL array and may be applicable to any VCSEL, modified or unmodified, now known or later developed. FIG. 7 shows a generic VCSEL structure 700 comprised of a quantum-well active region 702 located within an optical cavity spacer region 704. Next to the cavity region 704, on one side, is disposed a first DBR mirror 706, itself comprised of a number of high/low refractive index layer pairs 707. Disposed on this first DBR mirror 706, on the opposite side from the cavity 704, is a first partial metal layer 708 with a first hole or aperture 710 through which laser light can escape the cavity 704. On the opposite side of the cavity from the first DBR mirror is a second DBR mirror 712, itself comprised of a number of high/low refractive index layer pairs 713. The second DBR mirror 712 is disposed upon a substrate layer 714 of a material which may have a high degree of transparency at the laser emitting wavelength. Disposed upon this substrate layer 714, on the opposite side from the second DBR mirror, is a second partial metal layer 718 with a second hole or aperture 720 along the axis of light emission through which laser light can escape the cavity. The surface of the substrate in the region defining the second hole in this second metal layer may be coated or uncoated with additional material or materials, such as coating layer 722. If coated, this additional material or materials may alter the reflective characteristics of the substrate final surface to make it low reflectance or high reflectance. In one embodiment, this surface is coated with a material to make it low reflectance. In at least one embodiment, a coating material may be silicon nitride. In at least one embodiment, the coating may have a thickness of about ¼ optical waves at the laser operating wavelength. Other materials and other thicknesses are within the scope of this disclosure.

More specifically, but still at a general level, epitaxial layers of a VCSEL may typically be formed on a substrate material, such as a GaAs substrate. On the substrate, single crystal quarter wavelength thick semiconductor layers may be said to be "grown" to form mirrors (e.g., n- and p-distributed Bragg reflectors (DBRs)) around a quantum well based active region to create a laser cavity in the vertical direction. As used herein, the terms "grown" may be considered to have a similar meaning to "generated," "formed," or "produced," or other similar terms. Likewise, as used herein, the terms "formed" may be considered to be analogous to "generated" or "produced," or other similar terms. For example, on the substrate, first mirror layers may be grown, such as but not limited to layers forming an AlGaAs n-DBR, where the n- designates n-type doping. A spacer, such as but not limited to AlGaAs may be formed, produced or generated over the first mirror layers. Then, a quantum well based active region, such as but not limited to an AlGaAs/InGaAs multiple quantum well (MQW) active region, may be formed, produced or generated. along with another spacer layer, such as but not limited to an AlGaAs spacer. Over that, second mirror layers may be grown, such as but not limited to layers forming an AlGaAs p-DBR, where the p- designates p-type doping, over which a current spreader/cap layer may be formed, such as but not limited to, an AlGaAs/GaAs current spreader/cap layer. A contacting metal layer may be formed over the cap layer, leaving an aperture, typically with a round shape, of desired diameter generally centered over the axis of the VCSEL. In some embodiments, a dielectric cap may be formed within the aperture. More specific details regarding VCSEL structure and fabrication as well as additional VCSEL embodiments and methods for making and using VCSELs are disclosed, for example, in: U.S. Pat. No. 8,249,121, titled "Push-Pull Modulated Coupled Vertical-Cavity Surface-Emitting Lasers and Method;" U.S. Pat. No. 8,494,018, titled "Direct Modulated Modified Vertical-Cavity Surface-Emitting Lasers and Method;" U.S. Pat. No. 8,660,161, titled "Push-Pull Modulated Coupled Vertical-Cavity Surface-Emitting Lasers and Method;" U.S. Pat. No. 8,989,230, titled "Method and Apparatus Including Movable-Mirror MEMS-Tuned Surface-Emitting Lasers;" U.S. Pat. No. 9,088,134, titled "Method and Apparatus Including Improved Vertical-Cavity Surface-Emitting Lasers;" U.S. Reissue Pat. No. RE41,738, titled "Red Light Laser;" U.S. Publ. No. 2015/0380901, titled "Method and Apparatus Including Improved Vertical-Cavity Surface-Emitting Lasers;" and U.S. Publ. No. 2016/0352074, titled "VCSELS and VCSEL Arrays Designed for Improved Performance as Illumination Sources and Sensors;" of which the contents of each are hereby incorporated by reference herein in their entirety. The disclosure herein is not intended be limited to any particular VCSEL, VCSEL configuration, or VCSEL array and may be applicable to any VCSEL, modified or unmodified, of any of the foregoing patents or patent applications, and any other VCSEL now known or later developed. Without being limited to solely the VCSELs described in any one of the foregoing patents or patent applications, VCSELs suitable for various embodiments of the present disclosure or suitably modifiable according to the present disclosure include the VCSELs disclosed in the foregoing patents or patent applications, including any discussion of prior art VCSELs therein, as well as VCSELs disclosed in any of the prior art references cited during examination of any of the foregoing patents or patent applications. More generally, unless specifically or expressly described otherwise, any VCSEL now known or later developed may be suitable for various embodiments of the present disclosure or suitably modifiable according to the present disclosure.

Figure 8:
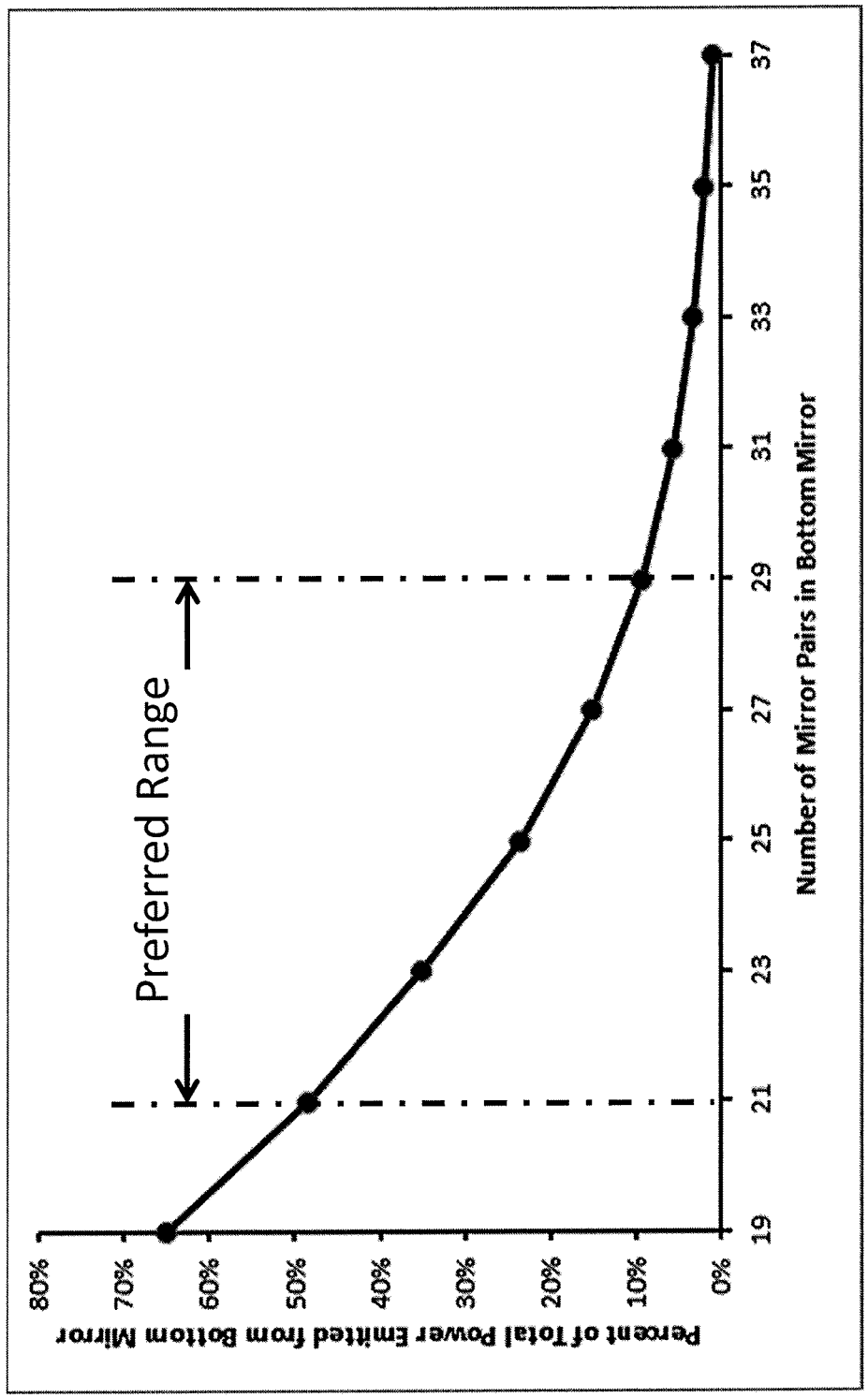
FIG. 8 is a graph illustrating the percent of total optical power emitted from one embodiment of a laser based on the structure of one mirror of the laser.

Each VCSEL may have one or more DBR mirrors, and in some embodiments, each VCSEL has two DBR mirrors. Each VCSEL may have one or more DBR mirror pairs. Depending on the relative reflectivities of the two DBR mirrors as determined by the number of constituent quarterwave mirror layers and the materials from which they are comprised, the ratio between the amount of power emitted from the top first surface to that emitted from the bottom second surface may be varied. In the above VCSEL structure, the number of DBR mirror pairs in the first mirror and the second mirror together determine the amount of optical power emitted from the first aperture and the second aperture, the sum of which is the total laser power. Using a transfer-matrix model, the ratio of the light emission power from the first aperture to the second aperture can be determined. FIG. 8 illustrates the ratio between the power and the mirror pairs, where it can be seen that for a mirror pair count in the second DBR ranging from 19 to 37, the percentage of total laser power emitted from the second aperture ranges monotonically from about 65% to about 0%.

The desired amount of second aperture emission, that which will be coupled to the sensor detector, is bounded on the low end by limits to receiver electronics sensitivity and noise and by the high end by having adequate first aperture emission to illuminate the target and generate adequate reflected return signal to lead to self-mixing within the laser. A sampled portion in the range of 10% to 50% total laser power emitted from the second aperture adequately captures the range of applications of interest. In some embodiments, the sampled portion may be in the range of 10 to 50 percent, or 15 to 49 percent, or 20 to 50 percent, or 25 to 50 percent, or less than 50 percent, or not more than 50 percent, or not less than 10 percent, or not less than 18 percent, or not more than 40 percent, or between 12 and 33 percent; other suitable ranges or values may be used. For any given application and for this particular VCSEL design, a possible number of mirror pairs in the second DBR may range in some embodiments from 21 to 29, although any number of mirrors may be used.

Laser light is composed of spontaneous emission and stimulated emission. Stimulated emission is the desired highly directional laser beam. Spontaneous emission is an isotropic light emitted broadly into many directions and does not contain the information content of the modulated laser beam. Therefore, spontaneous light coupled into the detection system represents an undesirable DC offset and noise source that degrades sensor performance. The second partial metal layer with the patterned second aperture serves as a light-blocking mechanism, or spatial filter, that stops the majority of spontaneous light from reaching the detector surface.

Figure 9:
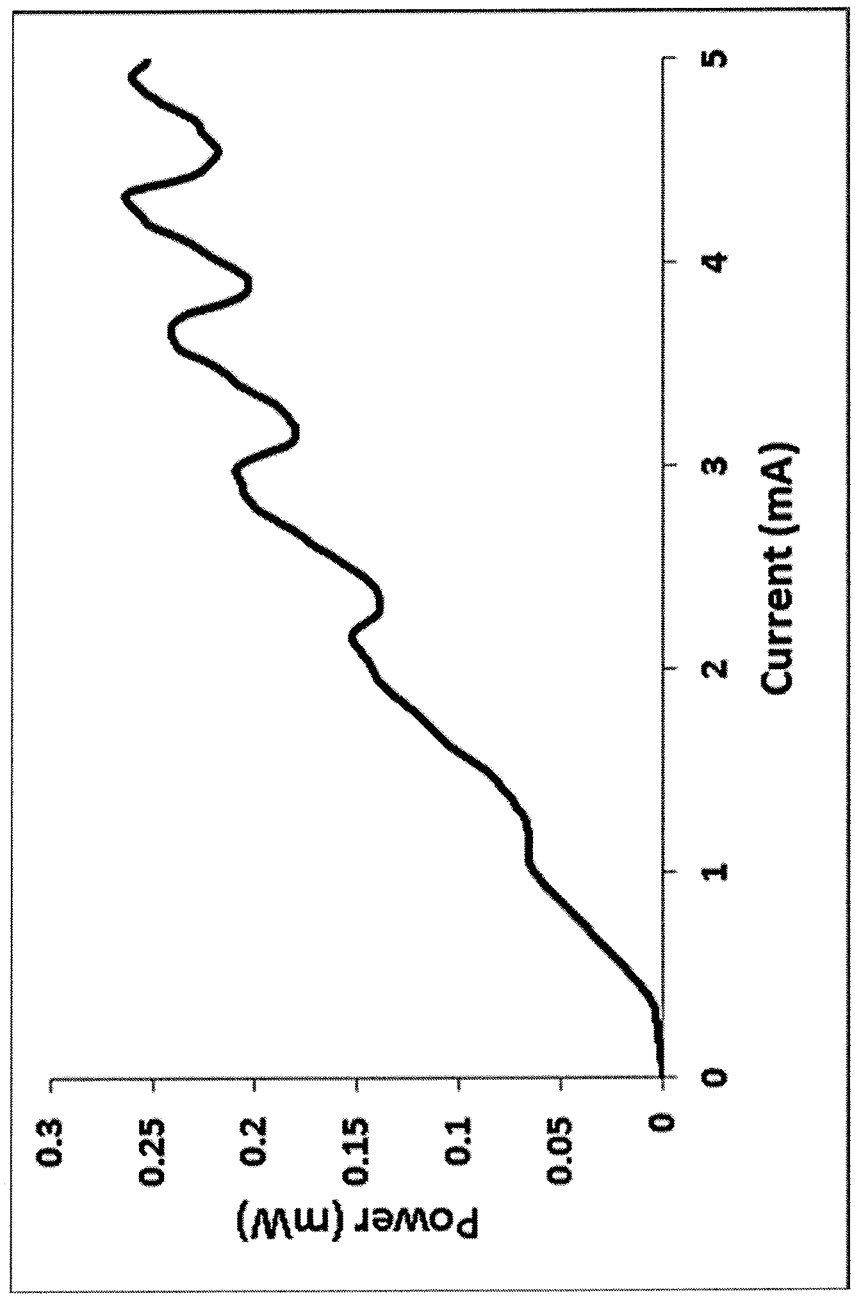
FIG. 9 is a graph illustrating the observed VCSEL output from the partially reflecting bottom surface.

As described above, an etalon is comprised of an optically transparent substrate, planar in nature with the co-planar surfaces, with mirrors disposed on each of the two surfaces. The VCSEL shown FIG. 7 is comprised in part of a DBR mirror disposed upon a planar transparent substrate that can, for some configurations, utilize a transparent material. In particular, GaAs is essentially transparent at 940 nm. The side of the substrate opposite the DBR, due to the means of fabricating the VCSEL, is generally highly planar and parallel to the DBR. Therefore, by coating the substrate surface opposite the DBR with a multi-layer highly reflective coating, an etalon can be formed that is directly integrated with the VCSEL at low cost and complexity. The performance of the integrally formed etalon will be lower than that achievable with a collimated beam and an external etalon due to the beam size and divergence, but it may nonetheless yield performance adequate to enhance the self-mixing signal significantly. To illustrate, FIG. 9 shows the bottom-side emission from a VCSEL designed for approximately 30% substrate emission obtained by sweeping the device drive current and monitoring the bottom emitted light using a photodetector with a VCSEL substrate thickness of about 100 µm. The periodic ups-and-downs or fringes in the light output are characteristics of the etalon formed by the VCSEL bottom DBR and the surface of the silicon detector on which the VCSEL is glued with a bondline thickness of less than 25 µm. The bottom surface of the VCSEL is coated with an anti-reflective (AR) coating and therefore may have a reflectivity estimated at less than 5%, while the silicon detector reflectivity is estimated to be 10% or less. The DBR mirror on the other hand hay have a reflectivity >99.9%. Based on the known tuning characteristic of the VCSEL wavelength with drive current, the FSR of the VCSEL-substrate etalon may be estimated at about 0.180 nm, while the finesse is <1. By increasing the reflectivity of the substrate-air interface with a multi-layer dielectric coating, preferably to more than 50% reflectance, and increasing the substrate thickness to more than 200 µm, a desirable level of etalon performance for self-mix enhancement can be achieved, namely an FSR of less than about 0.6 nm with a finesse more than 5.

Figure 10:
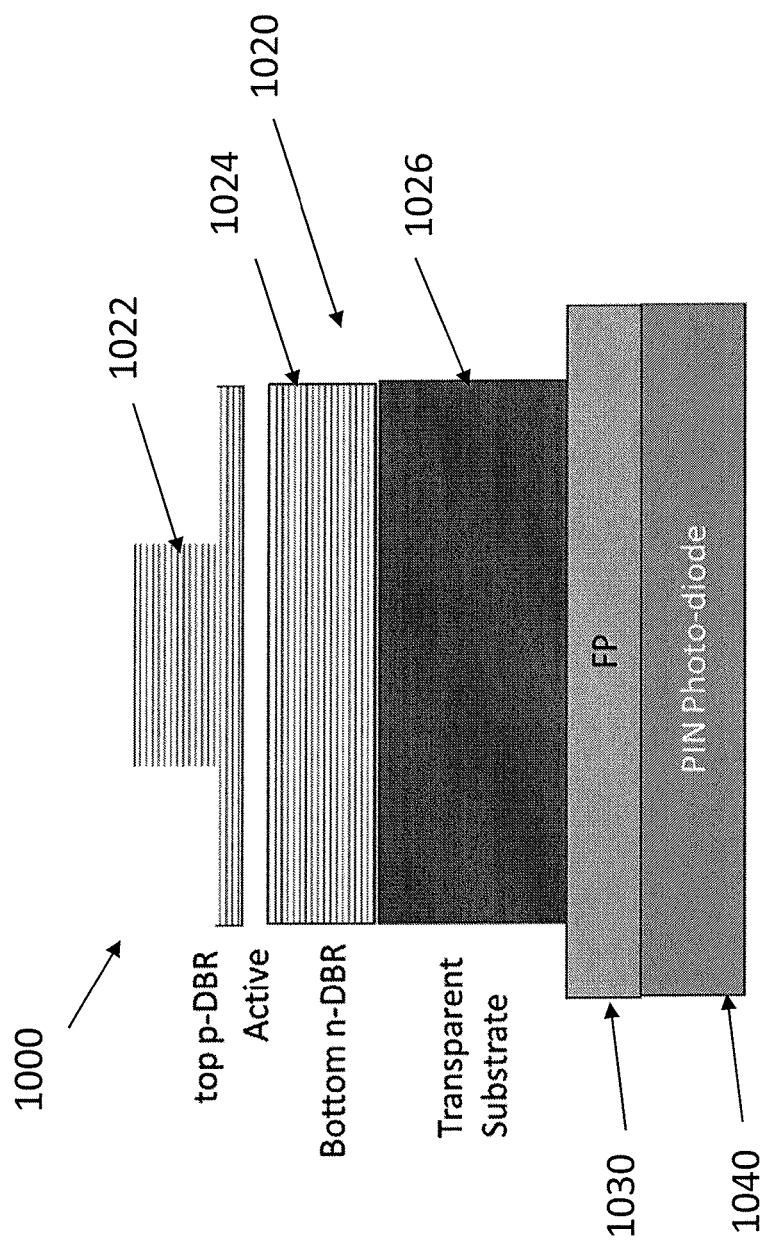
FIG. 10 is a schematic view of a stacked VCSEL integration with an etalon filter and photodetector suitable for VCSELs fabricated on transparent substrates.
Figure 11:
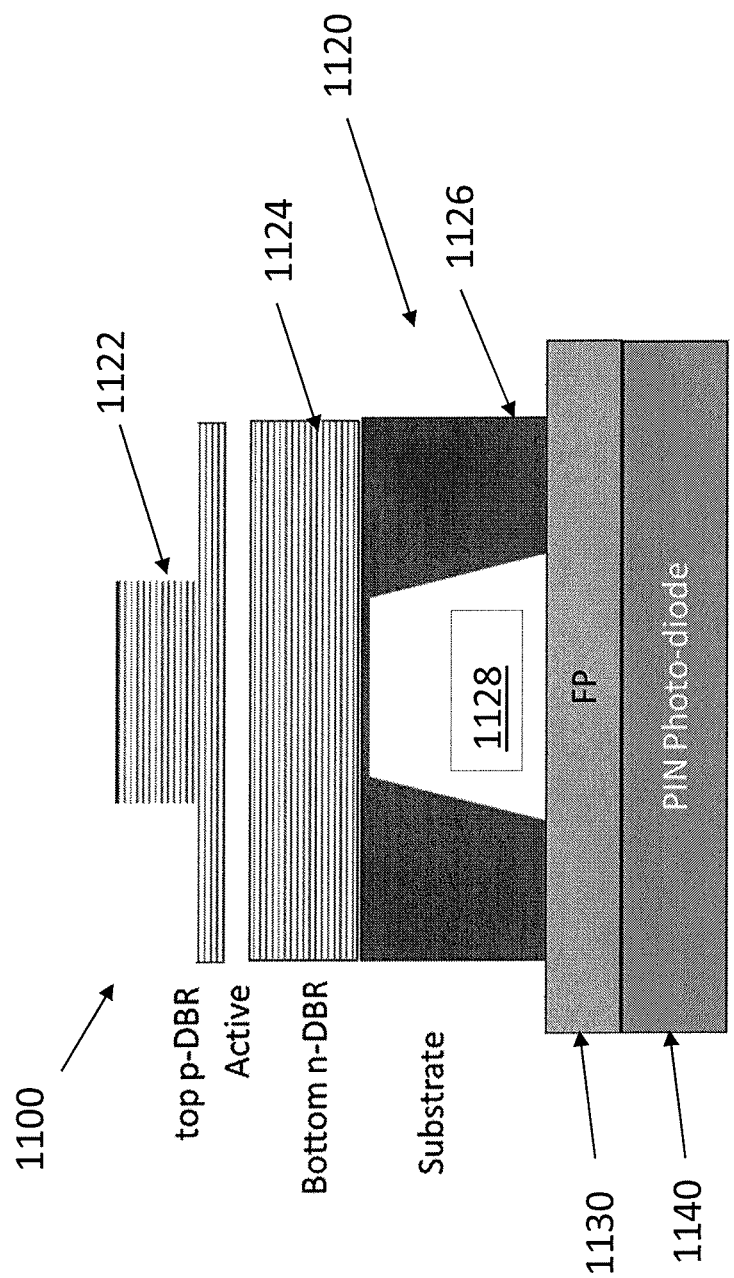
FIG. 11 is a schematic view of a stacked VCSEL integration with an etalon filter and photodetector suitable for VCSELs fabricated on absorbing substrates.

FIG. 10 and FIG. 11 illustrate two approaches for integrating a filter, such as a Fabry-Perot etalon filter, together with a photodiode and a partially bottom-emitting VCSEL in a chip-scale hybrid approach to the device 1000, 1100. FIG. 10 illustrates the case where the VCSEL substrate transmits the VCSEL wavelength. This approach would be suitable for wavelengths in the range of 900 nm to 1300 nm, where the VCSEL may still be deposited on a GaAs substrate, but the GaAs would be transmissive to the wavelength of light emitted from the VCSEL. Of course, the approach could be used for emissions at other wavelengths. FIG. 10 shows the device 1000 comprising a VCSEL 1020 with a top DBR mirror 1022, a bottom DBR mirror 1024, and a transparent substrate 1026. The VCSEL 1020 is mounted directly on top of a filter 1030, which in turn is mounted directly on top of a photodiode 1040 such as, but not limited to, a PIN photodiode or a p-i-n photodiode. FIG. 11 illustrates the case where the VCSEL substrate is absorbing for the wavelength emitted by the VCSEL. This would be a suitable approach for wavelengths in the range of 680 nm to 900 nm, where the VCSEL would normally be grown on a GaAs substrate which is absorbing at those wavelengths. Of course, the approach could be used for emissions at other wavelengths. FIG. 11 shows the device 1100 comprising a VCSEL 1120 with a top DBR mirror 1122, a bottom DBR mirror 1124, and a substrate 1126. The substrate 1126 may have a channel 1128 etched into the substrate. In at least one embodiment, the channel 1128 may be etched all the way to the epitaxial layers the VCSEL or the bottom DBR mirror 1124. In at least one embodiment, the channel 1128 may be V-shaped as shown, or the channel 1128 may have other configurations. The channel 1128 may extend axially through the entire length of the substrate or it may extend only for a portion of the substrate. The VCSEL 1120 is mounted directly on top of a filter 1130, which in turn is mounted directly on top of a photodiode 1140 such as, but not limited to, a PIN photodiode or a p-i-n photodiode. In either the case of FIG. 10 or FIG. 11, it should be noted that the filter 1030, 1130 could be omitted completely and the VCSEL laser mounted directly to the photodiode 1040, 1140 or detector. This may be desirable in the case of a self-mix sensor that did not need the signal enhancing features of the etalon filter.

Figure 12:
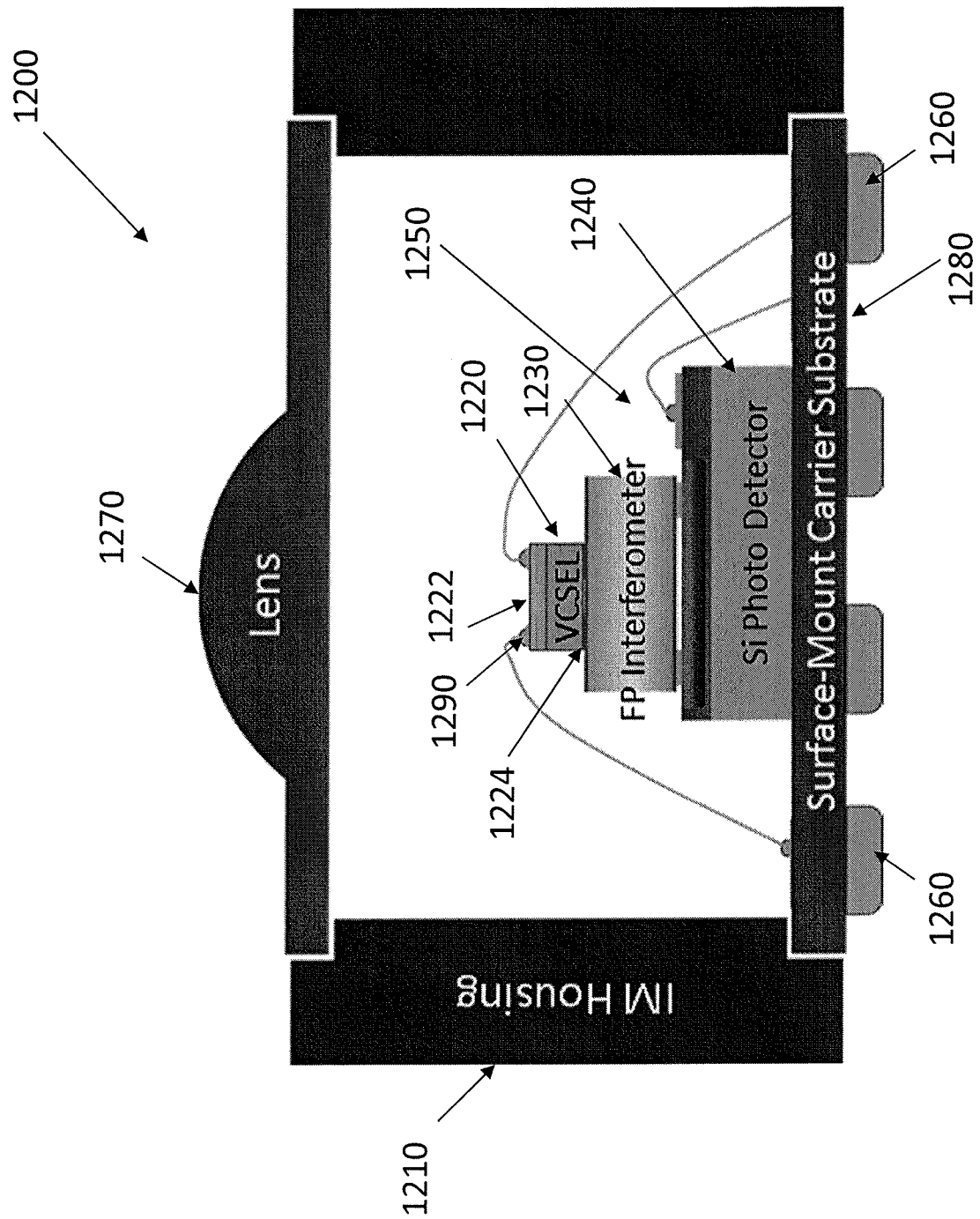
FIG. 12 is a schematic view of sensor packaging with direct stacking of a VCSEL, etalon, and photodetector.

FIG. 12 shows one embodiment for packaging a sensor device 1200 of one or more embodiments of the present disclosure with direct stacking of a VCSEL, a filter, and a detector. In one or more embodiments, the device 1200 comprises a housing 1210, a VCSEL 1220 having a top surface 1222 and a bottom surface 1224, a filter or etalon 1230, a detector 1240, a plurality of contacts 1260, a lens 1270, and a substrate 1280. In at least one embodiment, the VCSEL 1220 may be a partially bottom-emitting VCSEL. The bottom surface 1224 of the VCSEL 1220 may be mounted directly onto the filter or etalon 1230, and the filter or etalon 1230 may be mounted directly to the detector 1240 to form a device assembly 1250. The filter 1230, being smaller in physical extent than the detector 1240, may be mounted to the detector 1240 using adhesive such that an air gap is maintained between the optical surfaces, or by other suitable means. In some embodiments, the VCSEL 1220 may likewise be mounted on top of the etalon filter 1230 such that an air gap is maintained between the optical surfaces. The device assembly 1250 may be positioned within the housing 1210, which includes a lens 1270 at one end of the housing near the VCSEL 1220 and a substrate 1280 with a plurality of contact pads 1260 at an end of the housing opposite the lens 1270. The lens may be integrally formed within the housing 1210 or attached to the housing 1210 at an opening of the housing. The detector 1240 can be mounted on the substrate 1280 with an adhesive or other suitable means, and the detector 1240 can be electrically connected to at least one contact pad 1260. The substrate 1280 may contain features for making electrical contact via wirebonding or conductive adhesive to the detector 1240 and/or the VCSEL 1220. One must make electrical contact to the photodiode or detector 1240, which is also a p-n function. If the photodiode is fabricated on a conductive substrate, then one side of the junction can be accessed by depositing a metal contact on the substrate side which is then attached to a conductive pad on the board or sub-mount the assembly is mounted to. The electrical attachment occurs by using a solder or conductive epoxy material, or by other suitable means, for the attachment. Contact is made to the other side of the p-n photodiode by making the photodiode slightly larger than the filter and wirebonding at the periphery. In at least one embodiment, the VCSEL 1220 is in electrical communication with the contact pads 1260.

Where the filter 1230 is a Fabry-Perot etalon filter, the filter 1230 transmits the light emitted by the VCSEL 1220. In one embodiment, the filter 1230 may have a top and bottom surface that are substantially parallel to one another. In order to have control over the wavelength dependence of the filter 1230, the filter 1230 is likely to be made of a sheet material such as glass, sapphire or quartz with reflective coatings on either side designed to achieve the required reflectivities, as may be specified by modeling. Since these materials for the Fabry-Perot filter are typically insulating, the VCSEL may be fabricated with co-planar contacts 1290, i.e. contacts to both sides of the p-n junction are made from the top surface 1222 of the VCSEL die. This is commonly achieved by etching down to the n-side of the junction from the top side of the chip, and patterning a metal contact that is routed from the top of the VCSEL die down into the etched region. The electrical contact to the VCSEL can be wirebonded either using topside processed anode and cathode connections or a combination of frontside and backside connections and patterned metallization on the etalon surface with conductive epoxy. Contacts can be "daisy-chained" by having a metal contact pad on the photodiode chip that is located outside the footprint of the filter and the VCSEL. This can then be electrically accessed by wire bonding. The substrate, package, or carrier 1280 is mated to the housing 1210, wherein the housing 1210 provides environmental or hermetic protection to the device assembly 1250. In at least one embodiment, the housing 1210 is made with injection molded plastic or other suitable materials for protecting the device assembly 1250. The housing 1210 can have provisions for attaching a collimating or focusing lens 1270 for directing the VCSEL light at the target and collecting back-reflected light to couple back into the laser cavity.

Figure 13:
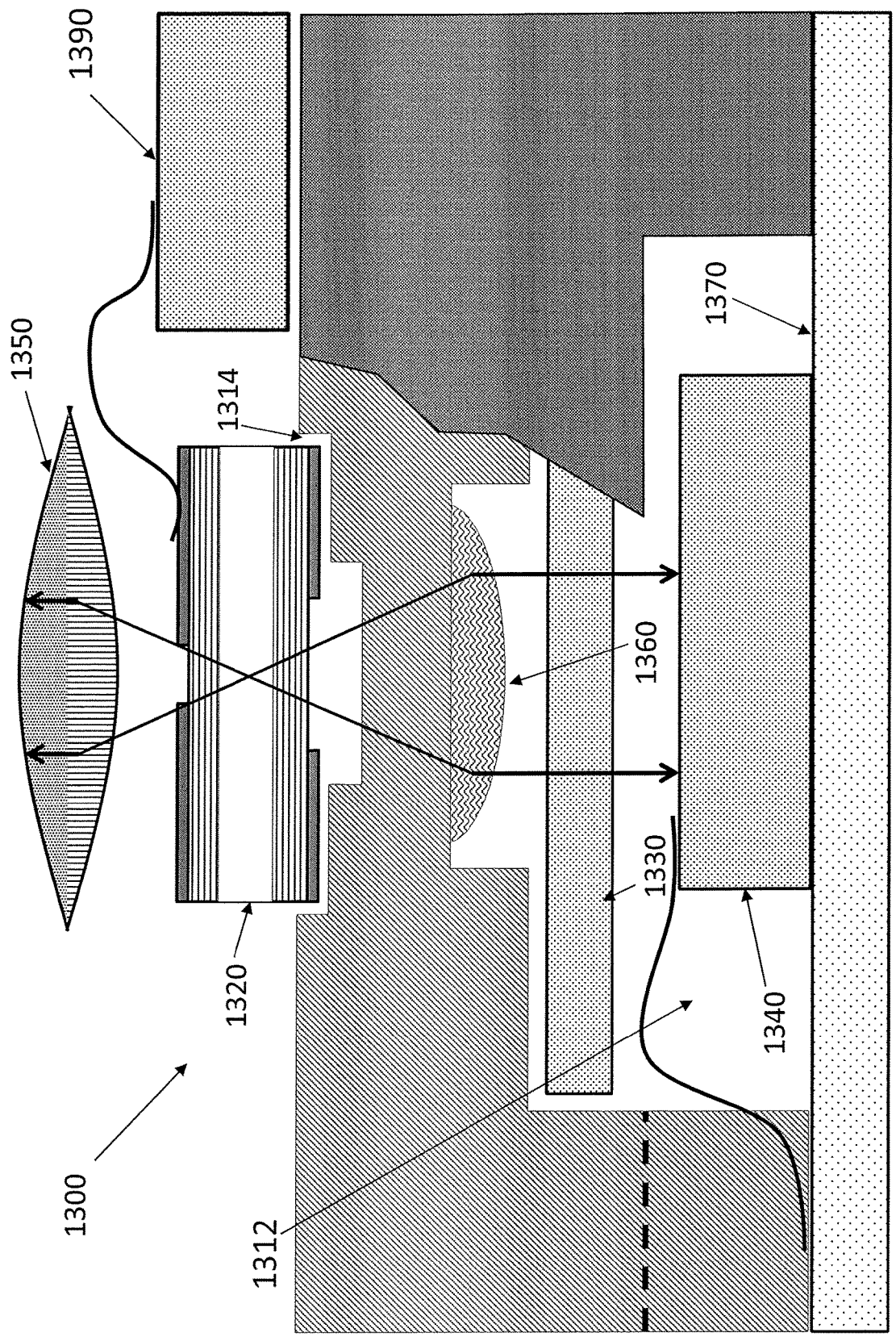
FIG. 13 is a schematic view of sensor packaging with a collimating lens before an etalon filter.

FIG. 13 shows another embodiment for a self-mixing sensor device 1300 comprising a housing 1310 defining an internal cavity 1312, a VCSEL 1320, a filter 1330, a detector 1340 for generating a photocurrent in response to light emitted from one aperture of the VCSEL, a first lens 1350 for focusing the VCSEL light emitted from another aperture onto a target (not shown), and a second lens 1360 for conditioning or collimating the light prior to being incident upon the filter 1330. The VCSEL 1320 may be a partially bottom-emitting VCSEL as described in some of the embodiments above, or it may be any other VCSEL of the present disclosure. The filter 1330 may be an etalon or other filter as described herein. The detector 1340 may be any type of detector as described herein, including, a silicon photo-detector with a self-mix modulation imposed thereon, and a second lens. In at least one embodiment, the detector 1340 is mounted to a substrate 1370. The VCSEL 1320, the filter 1330, the detector 1340 and at least the second lens 1360 may be assembled in a molded or stamped plastic, organic, or metal housing 1310 that provides means for alignment and passive assembly with no active alignment required. The various components may be affixed to and aligned by and within the housing. In at least one embodiment, at least the filter 1330 and the detector 1340 are disposed within the cavity 1312 of the housing. The second lens 1360 can be a separate component made of glass or plastic, or desirably molded as an integral part of the housing 1310. In at least one embodiment, the housing 1310 may also be attached to the substrate 1370. The substrate 1370 may contain features for making electrical contact via wirebonding or conductive adhesive to the detector 1340 and or the VCSEL 1320. The housing 1310 may, in some embodiments, incorporate electrical interconnect features for electrical connection with the VCSEL 1320 and/or the detector 1340 via wirebonding or conductive adhesive. These electrical interconnect features may include, but are not limited to a printed wiring board (PWB) 1390 with bonding "lands", fanouts, or a metallized substrate. The housing 1310 may incorporate clearance features, such as cutouts for wirebonds.

In one embodiment of the present disclosure shown in FIG. 13, the self-mixing sensor device 1300 comprises an injection molded plastic housing 1310 onto which is affixed a partially bottom-emitting VCSEL 1320, which may have a top-to-bottom emission ratio of 2:1 or other emission ratios. In at least the embodiment shown in FIG. 13, the housing 1310 may have a recess or other opening 1314 for receiving the VCSEL 1320. The VCSEL emits light at a wavelength of 940 nm. However, other wavelengths are suitable. The substrate surface of the VCSEL may be metallized with a patterned metal film, the pattern being a series of, for example, 20 μm diameter apertures aligned on the centers of the VCSEL emitting regions. The interior of the 20 μm diameter apertures may be coated with an anti-reflective coating consisting of ¼ optical wave of silicon nitride. The VCSEL may have anode and cathode electrical contacts on the top surface of the VCSEL chip. Placed beneath the VCSEL 1320 may be a lens 1360 that is formed as part of the injection molded housing 1310. The purpose of the lens 1360 may be to collimate the laser emission and expand the beam size. On the opposite side of the lens 1360 from the VCSEL 1320 may be an etalon 1330 to serve as the wavelength filter, which also may be affixed to the housing 1310. As an example, the etalon 1330 may be approximately 500 μm thick fused silica coated on either side with 80% reflective mirrors, yielding a finesse of 13.8, a bandwidth of 0.04 nm, and a free spectral range of 0.6 nm. The embodiment further comprises a sub-mount or substrate 1370 to which a silicon detector 1340 and the plastic housing are attached 1310. When assembled, the detector 1340 may be facing the final surface of the etalon 1330 with an intervening air gap. The substrate 1370 further provides the electrical interface to the device, namely the laser anode and cathode, and the detector anode and cathode. External to the housing may be a lens 1350 for focusing the laser beam at the target and collection the reflected return light. The lens 1350 also serves to couple a portion of the return light into the VCSEL cavity.

Figure 14:
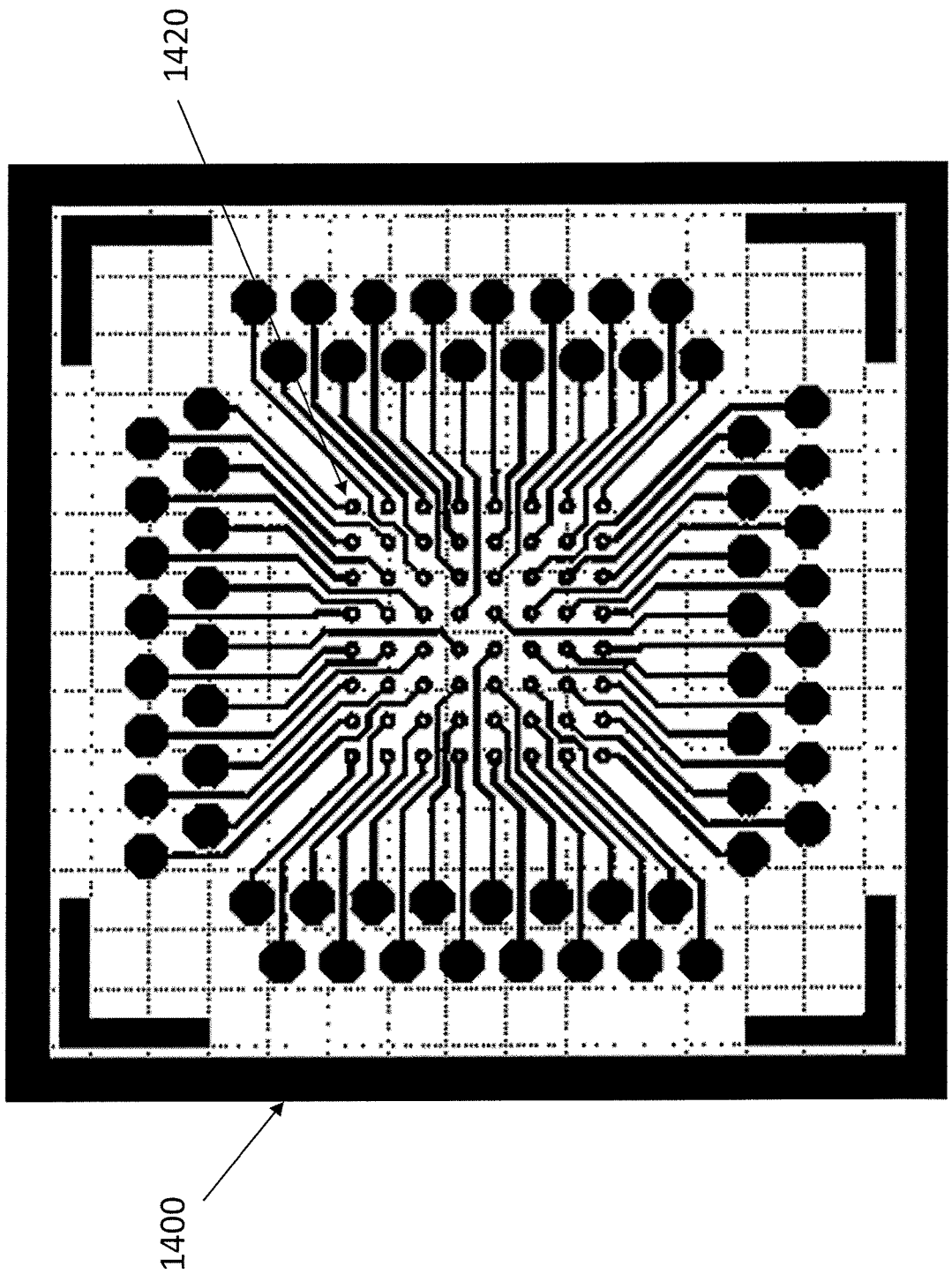
FIG. 14 is a schematic view of a VCSEL laser die with an 8×8 array of emitting apertures.

Another embodiment uses arrays of parallel connected or individually addressable VCSEL devices. VCSELs, for example the one shown in FIG. 7, can be manufactured in an array of individually addressable lasers in the same substrate, or connected in parallel at the chip-level or package-level. FIG. 14 is a layout of a chip 1400 that has an 8×8 array of individually addressable VCSEL lasers 1420 on the same die or chip. When used with an external lens, this configuration presents the means with which to implement one form of beam steering. Beam steering may be advantageous for probing single or multiple spatially separate locations or targets in the sensor field of view with no moving parts, without reorientation of the sensor. Beam steering can be accomplished by selectively turning on one or more lasers in the array. The array configuration is compatible with many of the other embodiments and innovative aspects of this disclosure, particularly integration of photodiodes via substrate emission and self-mix enhancement using an etalon filter.

Figure 15:
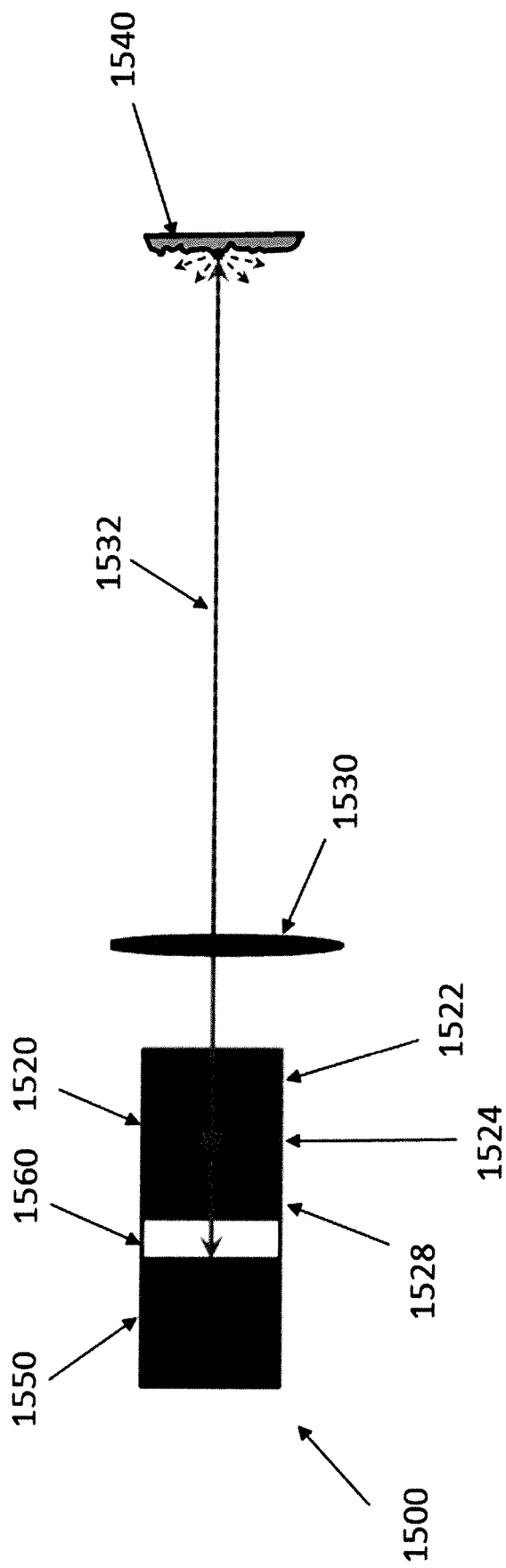
FIG. 15 is a schematic view of a self-mixing optical system, in accordance with one embodiment of the present disclosure.
Figure 16:
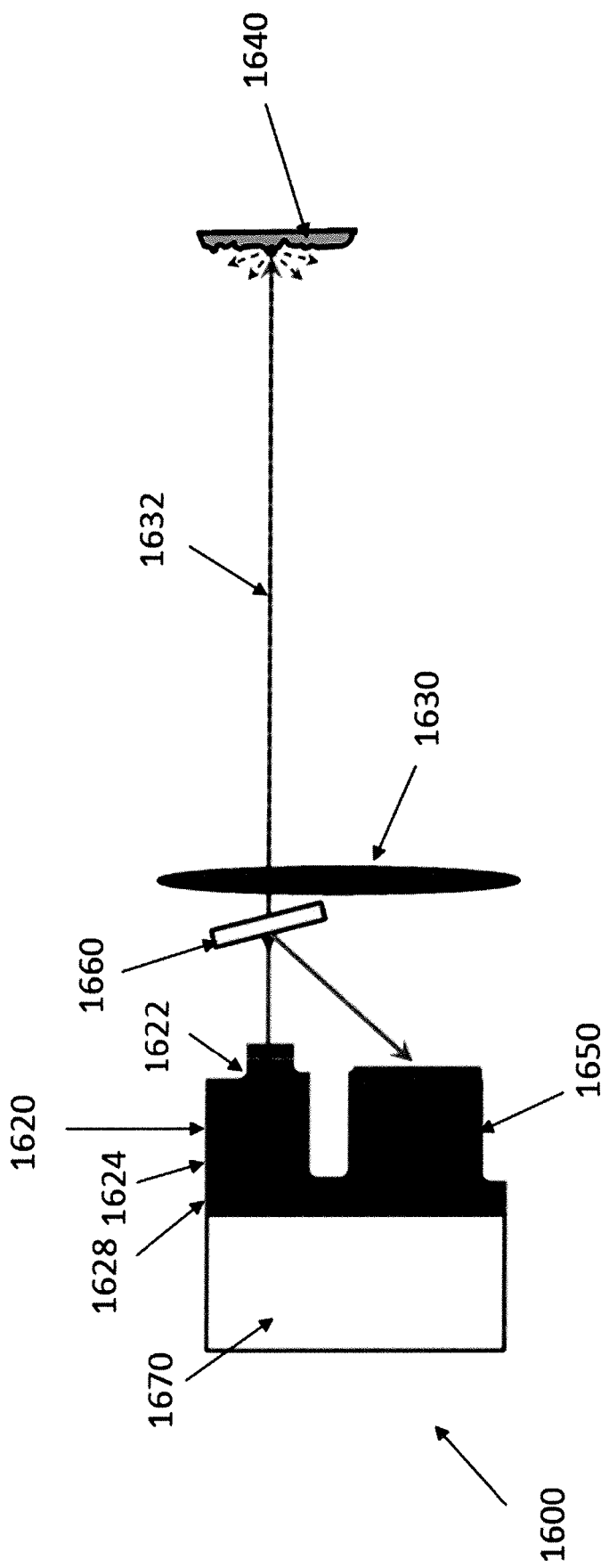
FIG. 16 is a schematic view of a self-mixing optical system, in accordance with one embodiment of the present disclosure.

FIGS. 15-16 show embodiments with a monolithic assembly that are similar to those shown in FIGS. 10-11. As shown in FIG. 15, a self-mixing sensor device 1500 comprised of a laser 1520 with a first mirror 1522, a light-generating cavity 1524, and a second mirror 1528; a first optical lens 1530 for focusing the light 1532 emitted from the said first mirror 1522 onto a partially reflective target 1540; and a monolithic photodiode 1550. Disposed between the monolithic photodiode 1550 and the second mirror 1528 is an optical filter 1560. FIG. 16 shows an alternative self-mixing sensor device 200 configuration again comprised of a laser 1620 with a first mirror 1622, a light-generating cavity 1624, and a second mirror 1628; a first lens 1630 for focusing the light 1632 emitted from the said first mirror 1622 onto a partially reflective target 1640; a monolithic photodiode 1650; and a beam sampling element 1660, that redirects a portion of the light 1632 from the first mirror 1622 onto the monolithic photodiode 1650. In one embodiment, the beam sampling element 1660 may be a beam splitter. In at least one embodiment, the beam splitter is positioned at an angle relative to the optical axis of the laser 1620. In at least the embodiment shown, a filter 1670 is connected to the laser 1620 and the monolithic photodiode 1650. In at least one embodiment, the laser 1620 and the monolithic photodiode 1650 are positioned in parallel on the same side of the filter 1670.

For the purpose of clarity, some embodiments may not be need to be operated continuously, or may not require that an emitted laser beam would continuously hit or reach an intended target. Rather, some embodiments may operate and may provide improved self-mix signal(s) only when or only if such emitted laser indeed hits the intended target, or only during time-slots in which such emitted laser beam actually causes a self-mix signal to be generated. In other embodiments, optionally, the laser beam may be manually directed towards an intended target, for example, by a human operator; or, the laser beam may automatically be directed towards an intended target, for example, by a slanting mechanism (e.g., having a motor or a mechanical arm).

In some embodiments, the laser(s) utilized are only "safe lasers" such that even if a laser beam or light emitted from the laser hits a human body, face, or eyes, such laser does not cause harm or damage to that human. In some embodiments, the laser may be used if, or only if, a human wears safety goggles or safety glasses or other body-covering gear to protect a particular body part, although this may not necessarily be required in other embodiments. Additionally or alternatively, some embodiments may utilize the laser only if, or when, it is aimed towards non-human target(s), or towards a region of the human that is safe or safer for aiming; for example, by using an automatic aiming mechanism, or by manually aiming the laser beam towards a safe or safer body part or target.

Any feature of any embodiment described herein may be used in any embodiment and with any features of any other embodiment.

As used herein, the terms "substantially" or "generally" refer to the complete or nearly complete extent or degree of an action, characteristic, property, state, structure, item, or result. For example, an object that is "substantially" or "generally" enclosed would mean that the object is either completely enclosed or nearly completely enclosed. The exact allowable degree of deviation from absolute completeness may in some cases depend on the specific context. However, generally speaking, the nearness of completion will be so as to have generally the same overall result as if absolute and total completion were obtained. The use of "substantially" or "generally" is equally applicable when used in a negative connotation to refer to the complete or near complete lack of an action, characteristic, property, state, structure, item, or result. For example, an element, combination, embodiment, or composition that is "substantially free of" or "generally free of" an element may still actually contain such element as long as there is generally no significant effect thereof.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

We claim:

1. A sensor device for laser light emission comprising:
    at least one partially bottom-emitting VCSEL laser emitting a light from at least one aperture, the laser comprising a cavity, a top surface mirror and a bottom surface mirror;
    a detector;
    a wavelength filter in a fixed position relative to the cavity; and
    a first optical lens for approximately focusing a portion of the light emitted by the laser onto a target surface;
    wherein a first optical path carries a first portion of the light emitted from the laser between the laser, the first optical lens, and the target surface and a second optical path carries a second portion of the light emitted from the laser between the laser and the detector;
    wherein the filter enhances signal amplitude of the second portion of the light;
    wherein the target surface is disposed only within the first optical path; and
    wherein the filter is disposed within the second optical path between the laser and the detector.

2. The sensor device of claim 1, wherein the filter is one of a grating or an etalon.

3. The sensor device of claim 1, wherein the laser has multiple apertures for emitting light.

4. A packaged sensor device comprising:
    a housing;
    a VCSEL laser having at least one mirror and a substrate, the VCSEL laser emitting a light from an aperture, the light having a wavelength, the VCSEL being at least partially received by the housing;
    a detector mounted to a substrate at a first end of the housing;
    a wavelength filter disposed between the laser and the detector; and
    at least one optical lens at a second end of the housing;
    wherein a first portion of the light is directed through the at least one lens and onto a target a second portion of the light is directed through the filter and onto the detector, and wherein the filter enhances signal amplitude of the second portion of the light.

5. The packaged sensor device of claim 4, wherein the filter is an etalon.

6. The packaged sensor device of claim 4, wherein the detector is selected from the group consisting of: a photodetector, PIN photodetector, a resonant cavity photodetector, or an avalanche photodiode.

7. The packaged sensor device of claim 4, wherein the filter has two faces in parallel, wherein each face has a mirror that is highly reflective at the wavelength.

8. The packaged sensor device of claim 4, wherein the housing has at least one feature for passive alignment and assembly of the laser and the filter.

9. The packaged sensor device of claim 4, wherein the substrate has a pattern of apertures on at least one side for the suppression of spontaneous emission of light.

10. A sensor device for laser light emission comprising:
    at least one VCSEL laser emitting a light from at least one aperture, the laser comprising a cavity and at least one mirror;

a detector;
a wavelength filter in a fixed position relative to the cavity, wherein the filter enhances signal amplitude of light directed to the detector;
a first optical lens that approximately focuses a first portion of the laser emission onto a target surface; and
a beam splitter between the first optical lens and the laser, wherein the beam splitter redirects a second portion of the light from the mirror onto the detector;
wherein a first optical path carries the first portion of the light between the laser and the target surface and a second optical path carries the second portion of the light emitted between the beam splitter and the detector.

11. The sensor device of claim 10, further comprising a second optical lens between the beam splitter and the detector, wherein the second optical lens approximately collimates light from the beam splitter and directs it onto the detector.

12. The sensor device of claim 10, wherein the target surface is disposed only within the first optical path.

13. The sensor device of claim 10, wherein the filter is disposed only within the second optical path.

14. The sensor device of claim 13, wherein the beam splitter is positioned at an angle relative to an optical axis of the laser.

15. The sensor device of claim 1, further comprising a second optical lens for approximately collimating light emitted from the bottom surface mirror and directing it towards the detector.

16. The sensor device of claim 1, wherein the at least one partially bottom-emitting VCSEL laser has a top-to-bottom emission ratio of 2:1.

17. The sensor device of claim 1, wherein the at least one partially bottom-emitting VCSEL laser has a top-to-bottom emission ratio between 1:1 and 10:1.

18. The sensor device of claim 1, further comprising a substrate, wherein the bottom surface is coated with a low-reflectivity coating.

19. The sensor device of claim 1, wherein relative reflectivities of the top surface mirror and the bottom surface mirror are chosen for a selected ratio of light emitted from a top surface to light emitted from a bottom surface.

20. The sensor device of claim 1, wherein the filter has at least one passband of narrow extent and of a wavelength such that the light can be tuned to operate on a steep region of a passband.

* * * * *